(12) United States Patent
Saitoh et al.

(10) Patent No.: US 7,605,422 B2
(45) Date of Patent: Oct. 20, 2009

(54) SEMICONDUCTOR DEVICE

(75) Inventors: Masumi Saitoh, Kanagawa (JP); Ken Uchida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 11/846,830

(22) Filed: Aug. 29, 2007

(65) Prior Publication Data
US 2008/0054346 A1  Mar. 6, 2008

(30) Foreign Application Priority Data
Sep. 1, 2006 (JP) .............................. 2006-237306

(51) Int. Cl.
*H01L 29/792* (2006.01)
(52) U.S. Cl. .................... 257/324; 257/411; 257/353; 257/E29.309; 257/E21.18
(58) Field of Classification Search ................ 257/324, 257/E29.309
See application file for complete search history.

(56) References Cited

U.S. PATENT DOCUMENTS

| | | | |
|---|---|---|---|
| 6,037,221 A | 3/2000 | Lee et al. | |
| 6,172,397 B1 | 1/2001 | Oonakado et al. | |
| 6,963,104 B2 | 11/2005 | Wu et al. | |
| 2002/0100909 A1* | 8/2002 | Yamaguchi et al. | 257/59 |
| 2003/0042531 A1* | 3/2003 | Lee et al. | 257/315 |
| 2004/0264236 A1* | 12/2004 | Chae et al. | 365/154 |
| 2005/0051825 A1* | 3/2005 | Fujiwara et al. | 257/308 |
| 2005/0199944 A1* | 9/2005 | Chen et al. | 257/324 |
| 2006/0073657 A1* | 4/2006 | Herner et al. | 438/237 |
| 2006/0124991 A1 | 6/2006 | Ohba | |
| 2006/0157754 A1 | 7/2006 | Jeon et al. | |
| 2006/0193175 A1 | 8/2006 | Khang et al. | |
| 2006/0237706 A1 | 10/2006 | Enda et al. | |
| 2007/0012988 A1* | 1/2007 | Bhattacharyya | 257/314 |
| 2008/0157172 A1* | 7/2008 | Lee | 257/321 |

(Continued)

FOREIGN PATENT DOCUMENTS

| JP | 10-79442 | 3/1998 |
|---|---|---|
| JP | 2006-86206 | 3/2006 |

(Continued)

OTHER PUBLICATIONS

Masumi Saitoh, et al. "Effects of ultra-narrow channel on characteristics of MOSFET memory with silicon nanocrystal floating gates", International Electron Devices Meeting (IEDM) Technical Digest, IEEE, 2002, 4 pages.

(Continued)

*Primary Examiner*—Tu-Tu V Ho
(74) *Attorney, Agent, or Firm*—Oblon, Spivak, McClelland, Maier & Neustadt, L.L.P.

(57) ABSTRACT

A semiconductor device capable of realizing low-voltage drivability and large storage capacity (miniaturization) by achieving large threshold voltage shifts and long retention time while at the same time suppressing variations in characteristics among memory cells is disclosed. The device includes a semiconductor memory cell having a channel region formed in a semiconductor substrate, a tunnel insulator film on the channel region, a charge storage insulator film on the tunnel insulator film, a control dielectric film on the charge storage film, a control electrode on the control dielectric film, and source/drain regions at opposite ends of the channel region. The memory cell's channel region has a cross-section at right angles to a direction along the channel length, the width W and height H of which are each less than or equal to 10 nm.

20 Claims, 21 Drawing Sheets

FOREIGN PATENT DOCUMENTS

| | | |
|---|---|---|
| JP | 2006-190990 | 7/2006 |
| JP | 2006-203200 | 8/2006 |
| JP | 2006-229223 | 8/2006 |
| JP | 2006-294940 | 10/2006 |
| JP | 3878681 | 2/2007 |
| KR | 1997-0004044 | 1/1997 |
| WO | WO 2004/112042 A2 | 12/2004 |
| WO | WO 2006/062332 A1 | 6/2006 |

OTHER PUBLICATIONS

P.K. Ko, et al., "Enhancement of hot-electron currents in graded-gate-oxide(GGO)-MOSFETS", IEDM 84, 1984, pp. 88-91.

Robert Bez, et al., "Introduction to Flash Memory", Proceedings of the IEEE, vol. 91, No. 4, Apr. 2003, pp. 489-502.

Marvin H. White, et al., "On the Go with SONOS," IEEE Circuits & Devices, Jul. 2000, pp. 22-31.

\* cited by examiner

FIG.27

$$-\chi_c + \frac{\hbar^2 \pi^2}{2}\left\{\frac{1}{m_{wc}^* W^2} + \frac{1}{m_{hc}^* H^2}\right\} > -\chi_s + \frac{\hbar^2 \pi^2}{2}\left\{\frac{1}{m_{ws}^* W^2} + \frac{1}{m_{hs}^* H^2}\right\} \quad \cdots \quad (1)$$

$\chi_c$ : electron affinity (energy difference of from vacuum level to bulk material conduction band end)

$\chi_s$ : electron affinity (energy difference of from vacuum level to silicon conduction band end)

$m_{wc}^*$ : effective mass along the width of channel material $m_{hc}^*$ : effective mass along the height of channel material $m_{ws}^*$ : effective mass along the width of silicon with a <110> direction on (100) plane $m_{hs}^*$ : effective mass along the height of silicon with a <110> direction on (100) plane $W$ : channel width $H$ : channel height $\hbar$ : Dirac constant

SEMICONDUCTOR DEVICE

CROSS-REFERENCE TO RELATED APPLICATION

This application is based upon and claims the benefit of priority from Japanese Patent Application No. 2006-237306, filed on Sep. 1, 2006, the entire contents of which are incorporated herein by reference.

FIELD OF THE INVENTION

This invention relates generally to semiconductor device technologies and, more particularly, to semiconductor devices of the type having a nonvolatile semiconductor memory element.

BACKGROUND OF THE INVENTION

An electrically erasable programmable semiconductor storage element capable of retaining data even after power is shut off is called the nonvolatile semiconductor memory (NVSM). NVSM cells of this type are becoming more important for use as storage media in advanced electronics equipment, including handheld or "mobile" information processing tools. Today, these memories are in progress of development for achieving ultra-low voltage drivability and extra-large storage capacity. One of currently major NVSMs is a "Flash" memory of the type storing data by accumulation of electrical charge on a floating electrode made of polycrystalline silicon or "poly-silicon," which is disclosed, for example, in R. Bez et al., "Introduction to flash memory," Proceedings of the IEEE, Vol. 91, No. 4, pp. 489-502 (2003).

Unfortunately, flash memories with the floating electrode made of polysilicon suffers from a limit in miniaturization of on-chip circuit elements. This can be said because the polysilicon floating electrode is difficult in scaling in its lengthwise direction, posing a problem as to unwanted interference between adjacent memory cells occurring due to capacitive coupling therebetween. Another reason is that electrical charge carriers residing on the floating electrode are all disappeared upon occurrence of pin holes in a tunnel oxide film that serves to suppress leakage of charge between the floating electrode and its underlying substrate. This causes a problem as to the difficulty in making the tunnel oxide film thinner by thin-film fabrication processes. Accordingly, in recent years, diligent studies and researches are made to develop new NVSM devices in place of the existing flash memories.

One of such new NVSM devices is a silicon-oxide-nitride-oxide-silicon (SONOS) memory, which stores data by storing charge in a silicon nitride film. Teachings as to this SONOS memory are found in M. H. White et al., "On the go with SONOS," IEEE Circuits and Devices, Vol. 1, No. 4, pp. 22-31 (2000). See FIG. 33, which shows a typical sectional structure of SONOS memory.

This SONOS memory has a silicon substrate 100 of p type conductivity, with a channel region 105 is formed therein. On a surface of this channel region 105, a tunnel dielectric film 120 is formed, which is made of silicon oxide. On this tunnel insulator film 120 a charge storage dielectric film 122 made of silicon nitride is formed. On this charge storage dielectric film 122 a control dielectric film 124 is formed, which is made of silicon oxide. Further, on this film 124 a control electrode 130 is formed, which is made of heavily-doped n ($n^+$) type polysilicon. At both ends of the channel region, a source region 141 and drain region 143 are formed, which are made of $n^+$-type silicon.

This device structure is thought to be equivalent to an n-channel field effect transistor (FET) having three terminals—i.e., the source/drain regions in Si substrate and control electrode—with a gate insulator film beneath the control electrode being replaced by a multilayer structure of the control dielectric film 124, charge storage dielectric film 122 and tunnel insulator film 120. The silicon nitride film making up the charge storage dielectric film 122 has a trap level. The charge storage dielectric film 122 is electrically insulated by the tunnel insulator film 120 from the Si substrate 100. The charge storage dielectric film 122 is electrically insulated by the control dielectric film 124 from the control electrode 130 also. Accordingly, the charge storage dielectric film 122 which has its trap level and which is insulated from its surrounding—namely, electrically floating—is capable of storing thereon electrical charge carriers.

To program or "write" data into this memory cell, a voltage of the positive polarity is applied between the Si substrate 100 and the control electrode 130, thereby causing electrons to be injected by quantum tunneling phenomena from the channel region into the charge storage dielectric film 122 made of silicon nitride. To read data out of this memory cell, a read voltage is applied between the source and drain regions 141 and 143 and also between the source region 141 and control electrode 130. The amount of a current flowing from the source region 141 to drain region 143 is different between a state that the SiN charge storage dielectric film 122 retains the injected electrons and thus is charged negatively and a state that no electrons are injected thereinto. Thus, by detecting this current value difference, in other words, a difference in transistor's threshold voltage, it is determinable whether the data is a logic "0" or "1."

To lower read error rates, it is desirable to enlarge the current value difference between the electron-injected state and no electron-injected state of the SiN charge storage dielectric film 122. One approach to doing so is to increase a difference of transistor threshold voltages, which will be referred to hereinafter as threshold voltage shifts. In order to enlarge the threshold voltage shifts in SONOS memories, it is considered to increase the volume of the charge storage dielectric film for storage of electrical charge—for example, make this film thicker.

In addition, in order to lengthen the data retention time that is one of the most important performance requirement for NVSM devices, a need is felt to sufficiently thicken the tunnel insulator film 120. This is because of the fact that if this tunnel insulator film is thin, its current leakage increases, resulting in a decrease in length of the data retention time.

However, simply thickening the charge storage dielectric film and the tunnel insulator film accompanies the risk of an unwanted increase in voltage needed when performing writing based on tunneling. This is a bar to achievement of ultralow voltage drivability. In addition, it becomes difficult to suppress short-channel effects, which in turn makes it difficult to miniaturize memory cell size dimensions by shortening the distance between source/drain regions, called the channel length. In other words, it becomes difficult to attain large capacity storage performance required.

One approach to avoiding the downscaling difficulty is to employ a three-dimensional (3D) device structure of the fin type, called the fin field effect transistor (FinFET) structure, to thereby suppress short-channel effects while at the same time letting the charge storage dielectric film and tunnel insulator film be kept thin. This method is disclosed in U.S. Pat. No. 6,963,104 B2 to Wu et al.

A micro-crystalline silicon memory device is also under study along with researches for SONOS memories, which device stores data through accumulation of charge at a silicon microcrystal or "nanocrystal" layer. A sectional view of a cell structure of this silicon nanocrystal memory is shown in FIG. 34.

This memory cell is similar in structure to the SONOS memory shown in FIG. 33, with the SiN film being replaced by an electrically conductive silicon nanocrystal grain layer 123. This cell stores data by injection of electrons into the silicon nanocrystal grain layer 123.

Regarding this memory cell, a fine line type 3D structure has been proposed, which has a channel region of not a planar structure but a fin type structure with its height reduced in order to enlarge the threshold voltage shift and lengthen the data retention time. For detail, see M. Saitoh et al., "Effects of ultra-narrow channel on characteristics of MOSFET memory with silicon nanocrystal floating gates," International Electron Devices Meeting (IEDM), pp. 181-184 (2002). An upper plan view of this fine-line silicon nanocrystal memory cell is shown in FIG. 35. Its sectional view taken along line A-A of FIG. 35 is depicted in FIG. 36 whereas a sectional view along line B-B is shown in FIG. 37.

As shown in FIGS. 36-37, this memory cell is fabricated by use of a silicon-on-insulator (SOI) substrate 100 having a buried oxide film 102 and an upper silicon layer thereon. In the Si layer of SOI substrate 100, a channel region 105 is formed. On both sides of this channel region 105, a source region 141 and drain region 143 are formed, which are made of n⁺-type silicon. Channel region 105 is of the fine-line 3D structure having its width (W) in the channel length direction (i.e., direction extending from the source to drain region) and height (H), each of which is set to 10 nanometers (nm) or below. The cell also includes a tunnel insulator film 120 made of silicon oxide, which is formed to surround the surface of channel region 105. This tunnel insulator film 120 has its surface on which the conductive silicon nanocrystal grain layer 123 is formed. This layer 123 has a surface on which a control dielectric film 124 made of silicon oxide is formed. On this film 124, a control electrode 130 is formed, which is made of n⁺-type polysilicon.

An advantage of this fine-line 3D silicon nanocrystal memory over standard silicon nanocrystal memories having a planar channel region has been reported to lie in its ability to achieve both the downscaling of cell size and the lowering of the write voltage by lessening the thickness of the tunnel insulator film.

Unfortunately, even the SONOS memory having fin-type channel region and the fine-line silicon nanocrystal memory are faced with difficulties in achieving further advances in low-voltage drivability and large capacity storability (miniaturization). More specifically, it is still difficult for these known memories to establish increased threshold voltage shifts, long data retention time and reduced variations in characteristics between memory cells, which are strictly required to attain further miniaturization.

SUMMARY OF THE INVENTION

The present invention was made in view of the above-noted technical background, and its object is to provide a semiconductor device capable of realizing both low-voltage drivability and large storage capacity (miniaturization) by achieving large threshold voltage shift and long retention time while at the same time suppressing variations in characteristics among semiconductor memory cells.

In accordance with one aspect of this invention, a semiconductor device having a memory element is provided. The memory element includes a channel region formed in a semiconductor substrate, a tunnel dielectric film formed on the channel region, a charge storage dielectric film on the tunnel dielectric film, a control dielectric film on the charge storage dielectric film, a control electrode the control dielectric film, and a pair of source and drain regions formed on both sides of the channel region. The channel region has a cross-section perpendicular to a channel length direction with its width and height being each set to 10 nanometers (nm) or less.

In accordance with another aspect of the invention, a semiconductor device is provided, which is formed on or above a semiconductor substrate having a buried dielectric layer. The device includes a series array of memory cells formed on the substrate. Each memory cell includes a channel region of a first conductivity type having a cross-section perpendicular to a channel length direction with its width and height being each set to less than or equal to 10 nm, a tunnel dielectric film formed on the channel region, a charge storage dielectric film on the tunnel dielectric film, a control dielectric film on the charge storage dielectric film, a control electrode formed on the control dielectric film, and a pair of spaced-apart source and drain regions of the first conductivity type as formed on both sides of the channel region. The cell array also includes a select gate transistor which is adjacent to a one end of the array of memory cells and which has a channel region of a second conductivity type and a pair of source and drain regions of the first conductivity type. The cell array further includes a source line contact region of the second conductivity type, which is formed beneath the source region of the first conductivity type of the select gate transistor and which is electrically connected to the channel region of the second conductivity type of the select gate transistor. The cell array further includes a source line contact plug that is electrically connected to the source region of the first conductivity type of the select gate transistor and is electrically connected to the source line contact region.

According to this invention, it becomes possible to provide the intended semiconductor device capable of realizing both low-voltage drivability and large storage capacity (miniaturization) by achieving large threshold voltage shift and extended retention time while at the same time suppressing unwanted variations in characteristics among semiconductor memory cells.

BRIEF DESCRIPTION OF THE DRAWINGS

FIG. 27 shows a mathematical formula explaining an operation of a semiconductor device having a SONOS NVSM memory cell in accordance with another further embodiment of the invention.

DETAILED DESCRIPTION OF THE EMBODIMENTS

Currently preferred forms of the present invention will be described with reference to the accompanying figures of the drawings below. In this specification, "channel region" is defined as semiconductor region at least at a tunnel insulator film side of which an inversion layer can be formed.

First Embodiment

Figure 1:
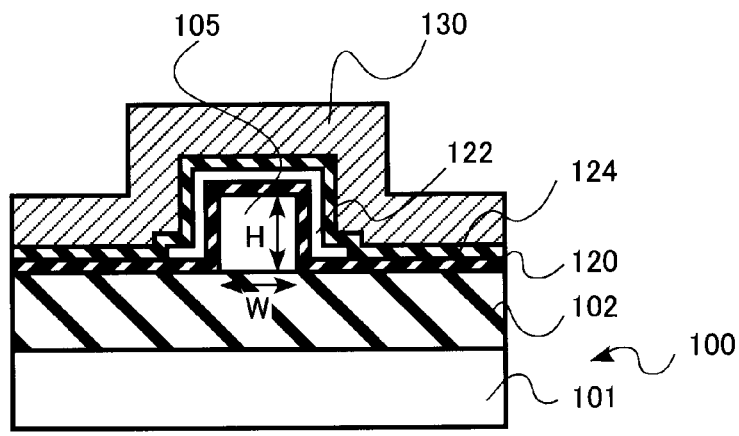
FIG. 1 is a diagram showing a cross-sectional view of a semiconductor device including a silicon-oxide-nitride-oxide-silicon (SONOS) nonvolatile semiconductor memory (NVSM) cell in accordance with one embodiment of this invention.
Figure 2:
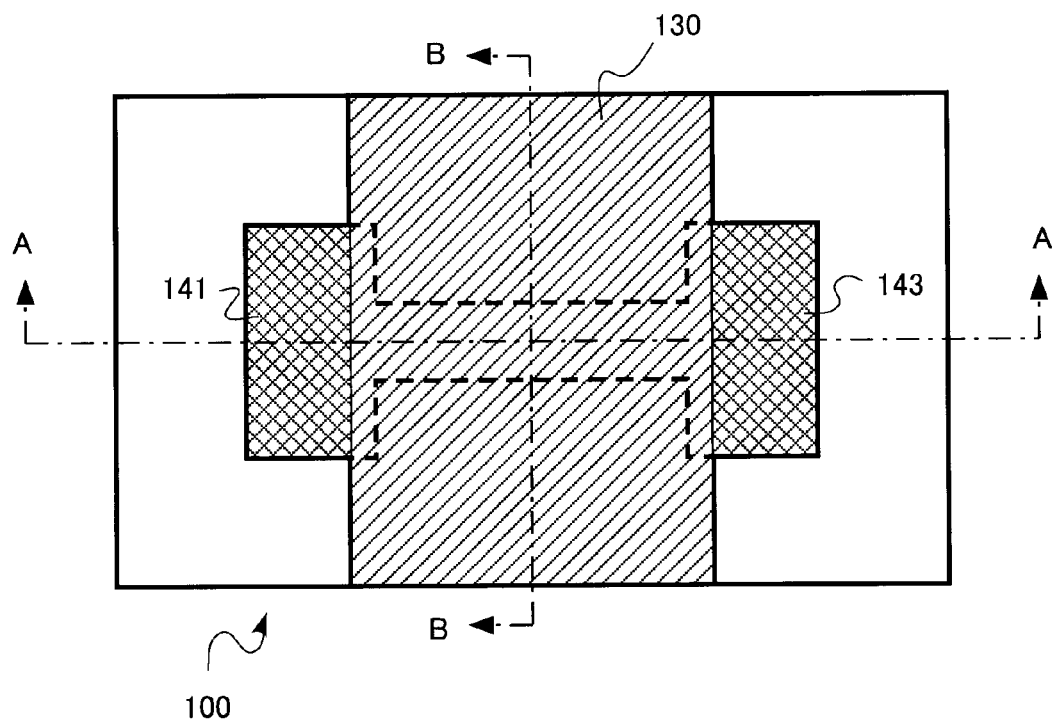
FIG. 2 shows an upper planar view of the semiconductor device having the NVSM cell while showing line A-A along which the sectional view of FIG. 1 is taken.
Figure 3:
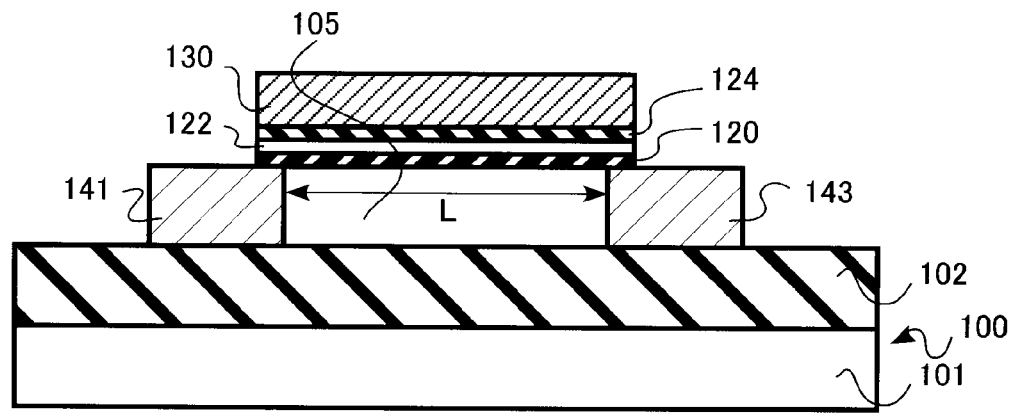
FIG. 3 is a sectional view of the NVSM memory device of FIG. 2 as taken along line B-B.

A semiconductor device having an electrically writable and erasable nonvolatile semiconductor memory (NVSM) circuit element in accordance with one embodiment of this invention is illustrated in FIGS. 1 to 3. A sectional view of the NVSM memory shown in FIG. 1 is taken along line A-A of its upper plan view shown in FIG. 2. Another sectional view of it is shown in FIG. 3 as taken along line B-B of FIG. 2.

The semiconductor device of the illustrative embodiment is a memory of the silicon-oxide-nitride-oxide-silicon (SONOS) type, which is formed on a semiconductor substrate having a layer of buried dielectric film. This SONOS memory has a channel region with the so-called fine-line type three-dimensional (3D) structure (referred to hereinafter as fine-line SONOS memory). The channel region is arranged so that its width and height are each set to 10 nanometers (nm) or less.

More specifically, as shown in FIG. 3, the NVSM cell is formed on a silicon (Si) substrate 100. This Si substrate 100 has a layer of buried dielectric film 102 formed therein, causing it to be divided into an upper Si substrate of p-type conductivity and a lower p-type Si substrate 101 with the buried dielectric film 102 being sandwiched therebetween. In the upper p-Si substrate, a channel region 105 is formed. This channel region 105 has its top surface, in which is formed a tunnel insulator film 120 that permits quantum tunneling of electrons. This film 120 is made of silicon oxide, for example. On a top surface of the tunnel insulator film 120, a charge-storing insulator film 122 is formed including therein an electron trappable energy level. An example of the charge storage insulator film 122 is a silicon nitride film. Charge storage insulator film 122 has its top surface, on which is formed a control dielectric film 124 made, for example, of silicon oxide. On a surface of the control dielectric film 124, a control electrode 130 is formed, which is made of polycrystalline silicon or "polysilicon," as an example.

As shown in FIG. 3, a source region 141 and drain region 143 are provided on both sides of the channel region 105 having a channel length L. These regions 141 and 143 are doped with a chosen impurity of n-type conductivity, such as arsenic (As). As apparent from viewing FIGS. 1-3, channel region 105 is arranged to have a three-dimensional (3D) multilayer structure of the fine line type. This fine-line channel structure is featured in that the width W and height H of a cross-section perpendicular to the lengthwise direction of channel region 105 shown in FIG. 1 are each set at 10 nm or less.

The fine-line SONOS memory stated above is such that its channel region has the fine-line 3D structure. Owing to this structural feature, it is possible to significantly reduce the amount of electrical current flowing in the channel region 105 by only a small number of electrons that are trapped at the energy level in the charge storage insulator film. This makes it possible to enlarge a difference between a current flow when electrons are being trapped in the charge storage insulator film and a current flow when no electrons are trapped therein—namely, transistor threshold voltage shift. In addition, it becomes possible to appreciably extend the data retention time.

Note here that in this embodiment, the tunnel insulator film 120 and control dielectric film 124 are not exclusively limited to silicon oxide films and may alternatively be other similar suitable films, examples of which are silicon nitride films, hafnium oxide films or else.

Also note that while in the example above the width W and height H of a cross-section at right angles to the length direction of channel region 105 are each set to less than or equal to 10 nm, it is required for the illustrative structure to have its width and height greater than the unit lattice of silicon, at the very least, in order to function as the transistor.

Figure 4:
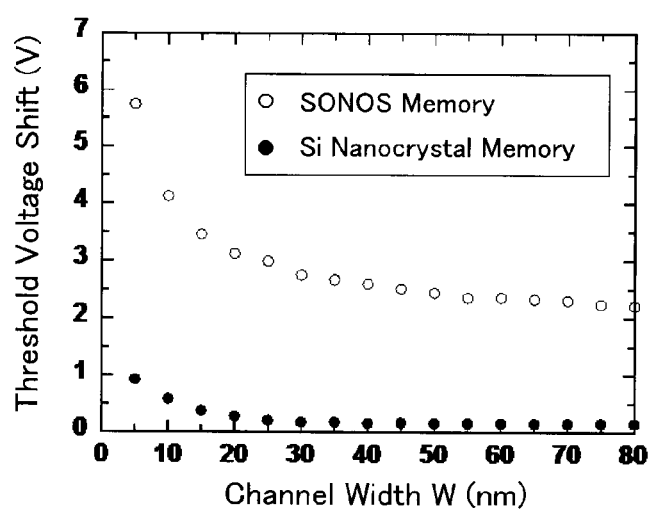
FIG. 4 is a graph showing calculation results of the dependency of threshold voltage shift upon the width W of a channel region in a fine-line type SONOS memory device embodying the invention.

See FIG. 4, which graphically shows calculation results of channel width W dependency of threshold voltage shift of the fine-line SONOS memory embodying the invention. In the calculation, the charge trap density in charge storage insulator film was set to 5E12 cm$^{-2}$, which is equivalent to that of silicon nitride films, the height H of channel region was set at 10 nm, channel length L was 100 nm, and the thickness of control insulator film was 10 nm. For comparison purposes, similar calculation results of a fine-line silicon nanocrystal memory are also shown. As for this silicon memory, calculations were done under conditions similar to those of the SONOS memory except that the charge trap density in charge storage insulator film was set to 5E11 cm$^{-2}$, which is the value of typical silicon nanocrystals.

As apparent from FIG. 4, letting the channel width W be less than or equal to 10 nm for the fine-line SONOS memory results in an increase in threshold voltage shifts.

Figure 5:
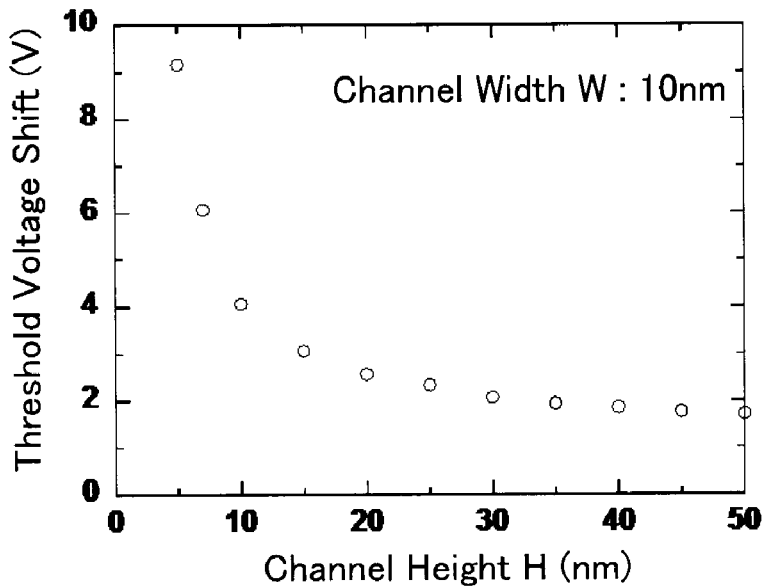
FIG. 5 is a graph showing calculation results of the dependency of threshold voltage shift upon channel region height H in the fine-line SONOS memory.

Next, regarding the fine-line SONOS memory embodying the invention, evaluation was done as to advantages of miniaturization of the channel height H in addition to the channel width W. Results of calculation of channel height dependency of threshold voltage shifts are shown in FIG. 5. The calculation was performed under similar conditions to those of the case of FIG. 4 except that the channel width W was set at 10 nm.

As apparent from FIG. 5, setting the channel height H at 10 nm or less results in an increase in threshold voltage shifts.

Figure 6:
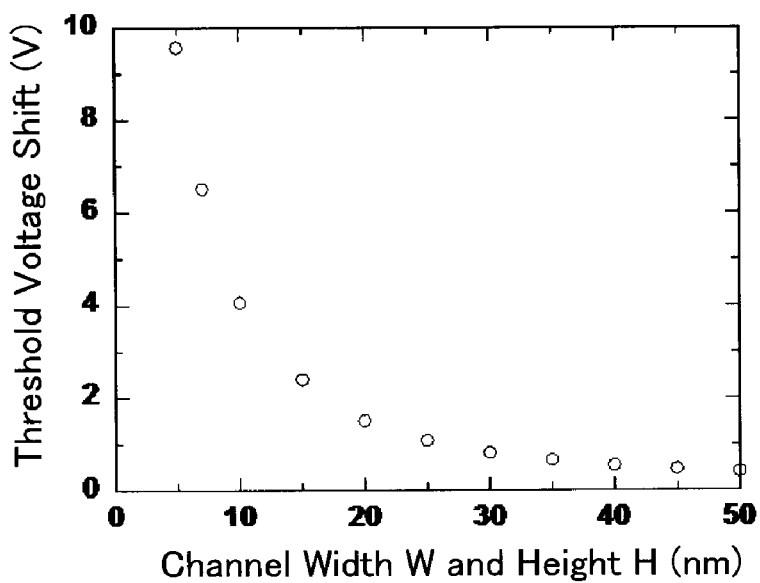
FIG. 6 is a graph showing calculation results of the dependency of threshold voltage shift upon channel region width W and height H in the fine-line SONOS memory.

Furthermore, the channel height/width dependency of threshold voltage shifts when the channel region's width W and height H are set equal to each other is shown in FIG. 6. Conditions in this case are similar to those of the cases of FIGS. 4 and 5 except for the setting of channel width/height equalization.

As apparent from FIG. 6, a noticeable increase in threshold voltage shift was obtained in a region with the channel width W and height H being equal to 10 nm or less.

In this way, significant increase in threshold voltage shift is obtainable by setting the width W and height H of SONOS memory channel region to 10 nm or less. Reasons considered are as follows. First, in the channel region of the fine-line 3D structure, electric field controllability is derived from electrons residing in charge storage insulator film portions on both sides of the channel region. When the channel region becomes narrower in width, the electric field controllability from the both sides of channel region becomes to cover an entire part in a direction along the width of such channel region. Further, when the channel region width is less than or equal to 10 nm, synergetic effects take place due to the overlapping of these electric field controllabilities from the both sides, thereby enabling the amount of a current flowing in the channel region to decrease significantly.

Additionally, when the channel region height H becomes 10 nm or less, the electric field controllability from those electrons existing in the charge storage insulator film overlying the channel region expands to cover the entirety in a direction along the height of such channel region. This also makes it possible to drastically reduce the amount of a current flowing in the channel region.

Accordingly, letting the channel width W and height H be less than or equal to 10 nm makes it possible to obtain synergistic effects of the electric field controllability from the both sides of channel region and the electric field controllability from the top face thereof. Thus it becomes possible to greatly lessen the amount of electrical current flowing in the channel region in case electrons exist in the charge storage insulator film. This leads to achievement of an appreciable increase in threshold voltage shifts.

It is apparent from the foregoing discussion that as a significant increase in threshold voltage shifts is obtainable in this embodiment, proper operability of memory circuit elements are guaranteeable even when reducing the charge storage amount of the charge storage insulator film. Thus it becomes possible to reduce the thickness of the charge storage insulator film, thereby enabling achievement of both the potential drop-down of a write voltage and the downscaling of element size dimensions.

In addition, as apparent from FIG. 4, the fine-line SONOS memory embodying the invention attains increased threshold voltage shifts when compared to fine-line silicon nanocrystal memories having the same channel width W and height H. In particular, an increase in threshold shift in the case of the channel width being set at 10 nm or less is noticeable in the fine-line SONOS memory.

The area density of charge-trappable nanocrystal particles in silicon nanocrystal memories is typically on the order of magnitude of 1E11 cm$^{-2}$. In FIG. 4, 5E11 cm$^{-2}$ was used as stated previously. Apparently, Si nanocrystal memories are low in area density of trap level than SONOS memory. Thus, even when employing the fine-line 3D channel structure design, it is hardly possible to achieve the intended threshold voltage shift comparable to that of SONOS memory because the electric field controllability from the electrons existing in charge storage insulator film is not sufficiently large.

Another disadvantage faced with known Si nanocrystal memories is that no appreciable threshold voltage shift amount increases occur unlike the case of SONOS memory. This can be said because sufficiently large synergetic effects are not obtainable even when the channel region is 10 nm or less due to the fact that the electric field controllabilities from the both sides of channel region are not so large in absolute value.

Consequently the fine-line SONOS memory of the illustrative embodiment offers its unique effects and advantages, including its ability to increase threshold voltage shifts in comparison with prior art memory devices.

It should be noted that in this invention, the area density of the trap level in charge storage insulator film falls within a range of from 5E12 cm$^{-2}$ and 1E14 cm$^{-2}$. This value setting is preferable because letting the area density be less than this range makes it difficult to obtain sufficient threshold shifts. Additionally when letting it be larger to go beyond this range, the distance between trap levels becomes less, resulting in electron transition between adjacent energy levels, which leads to risks of unwanted occurrence of charge punch-through in the event that pin holes occur in the tunnel dielectric film.

Additionally, in order to achieve low-voltage/large-capacity memory operations, it is important not only to enlarge threshold voltage shifts but also to lessen possible variations or fluctuations of threshold shifts between on-chip circuit elements. This can be said because a need is felt to increase the preset value of write voltage and/or to increase the preset value of the thickness of charge storage insulator film in order to absorb variations in threshold voltage shifts if such variations are large.

Figure 7:
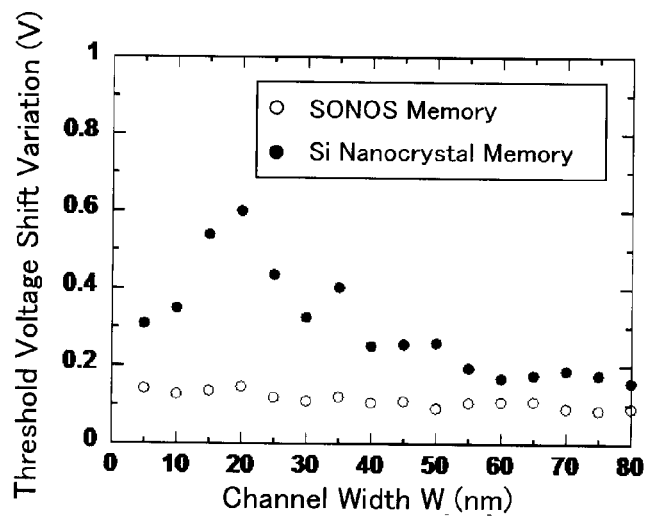
FIG. 7 is a graph showing calculation results of the dependency of inter-cell variation of threshold voltage shift upon channel region width W in the fine-line SONOS memory.

Turning to FIG. 7, calculation results are shown of the channel width W dependency of interelement variations of threshold voltage shifts in the fine-line SONOS memory embodying the invention. These interelement variations of threshold shifts are standardized by threshold voltage shift values. This calculation assumes that a chip under testing has a hundred of memory cells. The threshold shift calculation was done under an assumption that electrical charge carriers are trapped at a trap level at random position in the charge storage insulator film of each memory cell, thereby to obtain the standard deviation thereof. The standard deviation thus obtained is plotted as interelement variation. Also shown in FIG. 7 are calculation results of a fine-line silicon nanocrystal memory for comparison purposes. Additionally, conditions other than the charge trapping are similar to those used in the computation of data of FIG. 4.

As apparent from FIG. 7, the fine-line SONOS memory of this embodiment is less than the fine-line Si nanocrystal memory in interelement variations of threshold voltage shifts. Also importantly, such variations stay within a range less than 0.2, which poses no problems in a viewpoint of practical usage. It was also demonstrated that in the fine-line SONOS memory, the problem as to an increase in interelement variation otherwise occurring due to downsizing of the channel width W is not found unlike the fine-line Si nanocrystal memory.

It is considered that the reason for a decrease in interelement variation of the fine-line SONOS memory when compared to fine-line silicon nanocrystal memory is that the former offers enhanced creation of a trap level distribution averaging effect owing to its increased trap level density. In contrast, the reason for the interelement variation increase in the fine-line Si nanocrystal memory due to miniaturization of the channel width W is thought to be caused by a further decrease in trap level distribution averaging effect due to reduction of trap level number as a result of miniaturization.

As discussed above, the fine-line SONOS memory embodying the invention is superior over the prior art in that the former offers its unique advantage as to the capability of suppressing variations in threshold voltage shifts.

Also importantly, the fine-line SONOS memory of this embodiment is arranged so that its channel region is of the fine-line 3D structure. Owing to this feature, the energy level of a base or "ground" level rises up by quantum confinement effects when compared to the case of a planar structure. In other words, the effective conduction band end energy level is elevated when compared to the energy level at conduction band end in planar channel structures.

Figure 8:
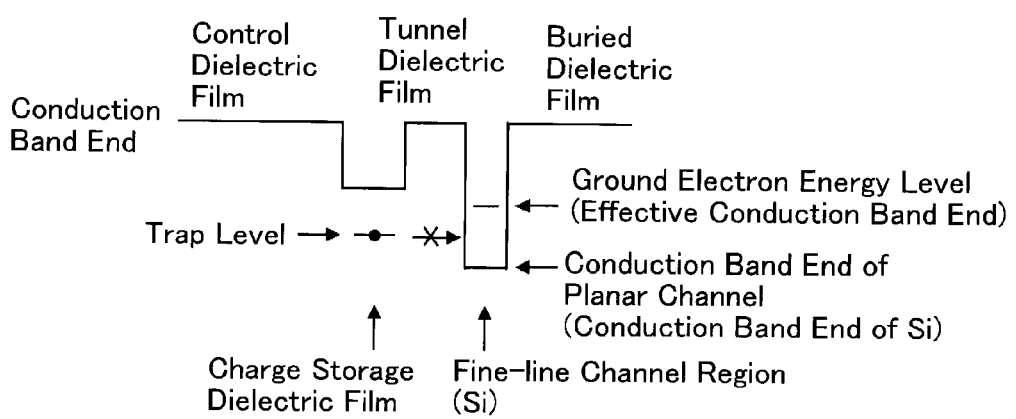
FIG. 8 is an energy diagram of the embodiment device in a direction perpendicular to the surface of a silicon substrate.

See FIG. 8, which is an energy diagram of the embodiment semiconductor device in a direction perpendicular to the surface of its silicon substrate. As shown in FIG. 8, the fine-line 3D structure exhibits elevation of the ground electron energy level of channel region—i.e., the effective energy level at an end of conduction band. With this elevation, it exceeds the energy level of trap level in the charge storage insulator film. This results in a decrease in tunnel probability (also known as charge release possibility) of electrons from the charge storage insulator film to the conduction band of channel region. Thus it is expectable to attain the effect as to an increase in data retention time of the memory.

Figure 9:
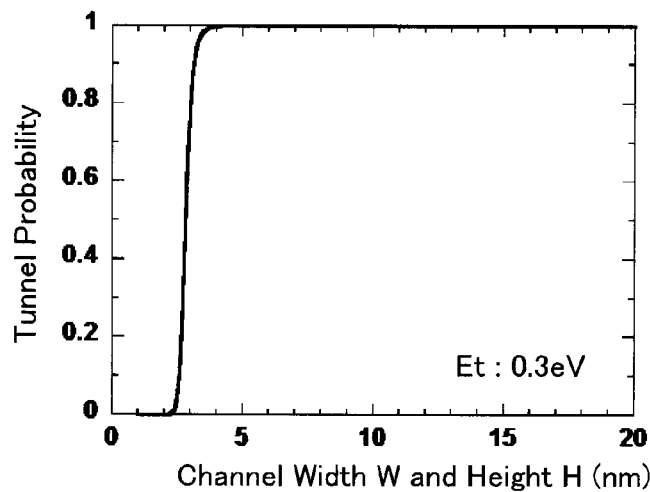
FIG. 9 is a graph showing calculation results of the dependency of electron tunneling probability from a charge storage insulator film to channel region of the embodiment device relative to channel region width W and height H.

See FIG. 9, which shows calculation results of the channel-width/height dependency of the tunnel probability of electrons of from the charge storage insulator film to the conduction band of channel region in case the channel width W and height H are the same as each other. The calculation assumes that the charge storage insulator film is a silicon nitride film while supposing that electrons are trapped to a trap level existing at a position lower by 1.8 eV from the SiN film's conduction band. The energy level, Et, of such trap level in charge storage insulator film with the conduction band end energy level of silicon being as a reference is given as Et=0.3 eV. Note here that the channel region is made of silicon with the channel length direction being set to <110> on a (100) plane.

As apparent from FIG. 9, when the channel width W and height H are each less than 4 nm, the electron tunnel probability decreases rapidly, resulting in an increase in the retention time of the memory. Consequently, with the use of this characteristic, it becomes possible to reduce the thickness of a tunnel dielectric film, thereby enabling dropdown of a write voltage and miniaturization or downscaling of memory cell size. In light of the discussion results, it is desirable in this invention that the channel width W and height H are each set to 4 nm or below.

An explanation will next be given of a method for fabricating the semiconductor device embodying the invention with reference to some of the accompanying drawings below. FIGS. 10 through 21 illustrate, in cross-section or upper plan view, some major process steps in the manufacture of the semiconductor device shown in FIGS. 1-3.

Figure 10:
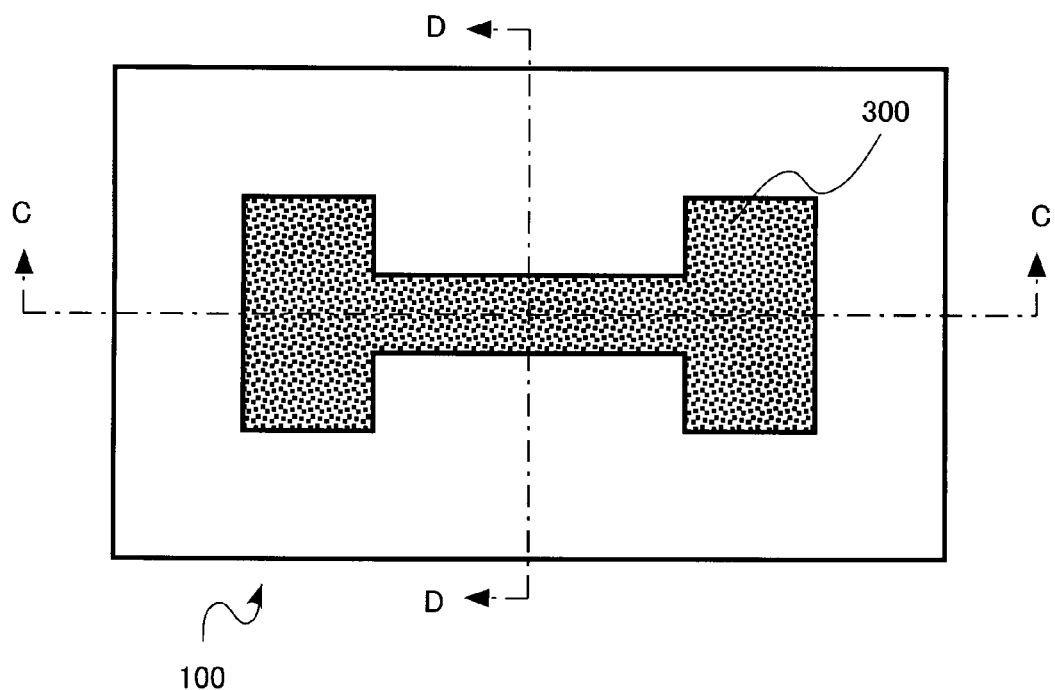
FIGS. 10 through 21 illustrate upper plan views and corresponding sectional views of the embodiment device at several process steps in the manufacture thereof.
Figure 11:
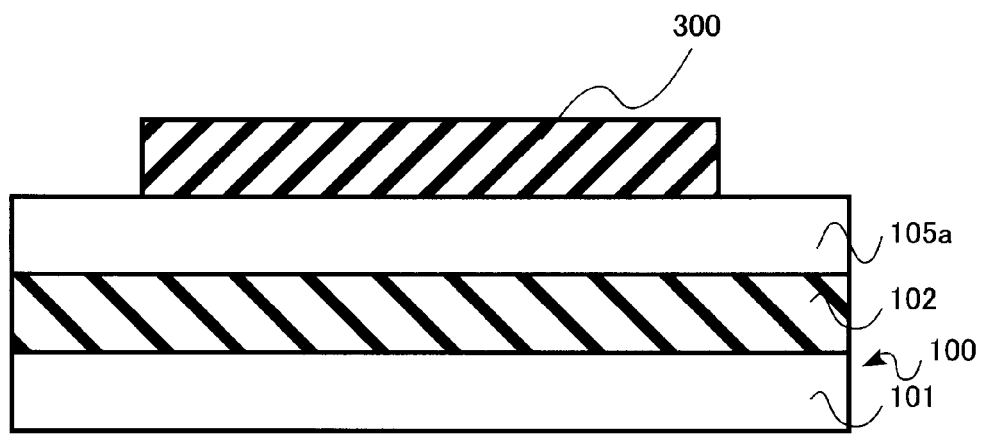
Figure 12:
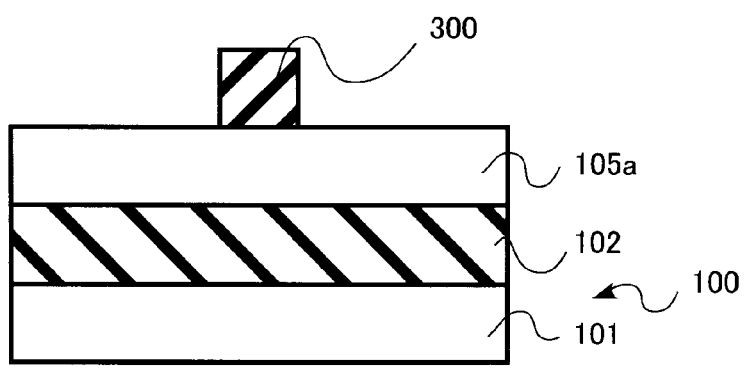

Firstly, as shown in an upper plan view of FIG. 10 and FIG. 11 which is a sectional view taken along line C-C of FIG. 10 and also FIG. 12 showing a D-D sectional view of FIG. 10, a p-type silicon substrate 100 with a (100) plane is prepared, which has a buried dielectric film 102 and an upper silicon layer 105a formed on its surface. Then, deposit a dielectric film 300 made of silicon nitride or like material to a thickness of about 50 to 100 nm, which film is for use as a mask. Thereafter, selectively remove the dielectric film 300 by lithography and anisotropic etch techniques, such as reactive ion etching (RIE). At this time, use a mask pattern which causes a portion for later use as the source region to be greater in width than a channel region as shown in FIG. 10.

Figure 13:
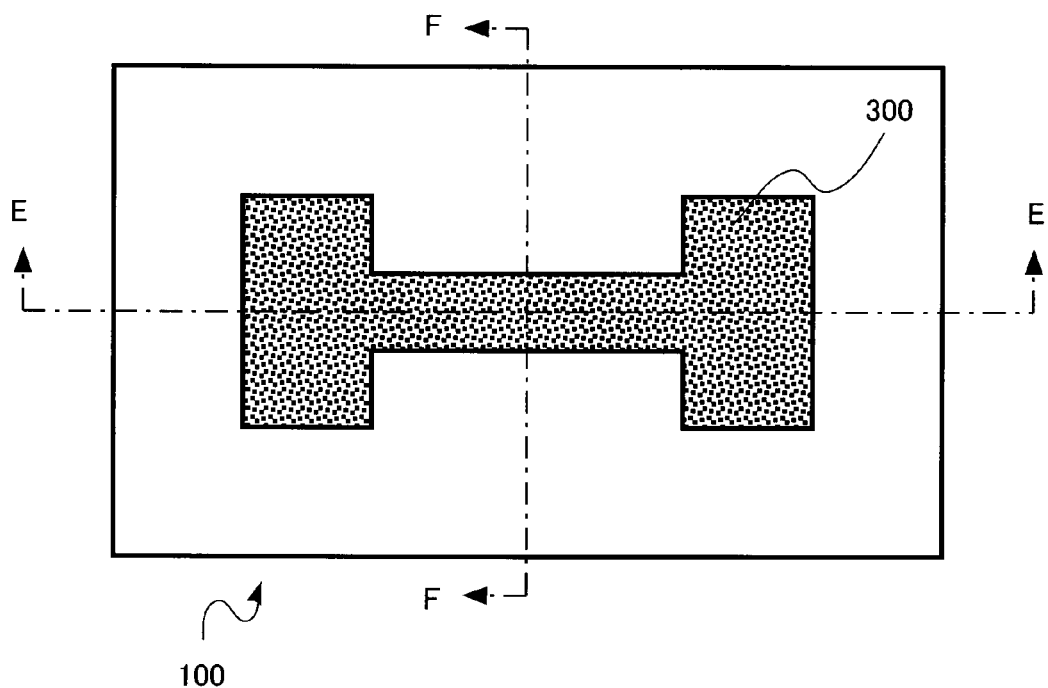
Figure 14:
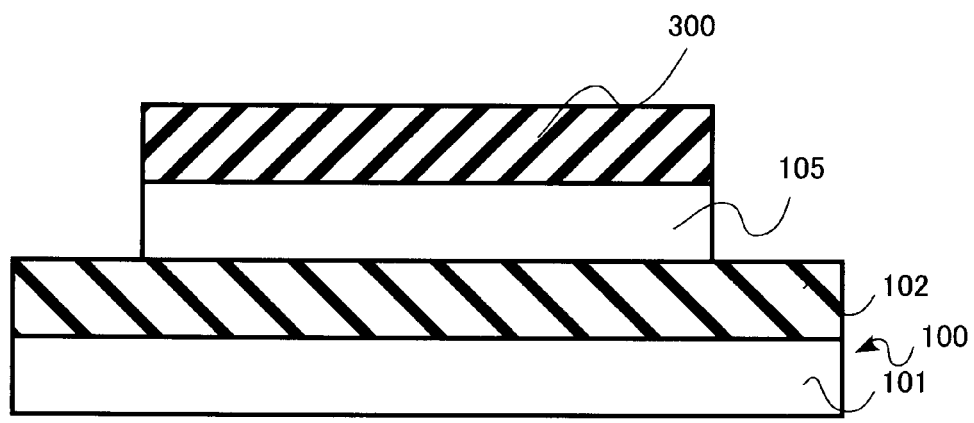
Figure 15:
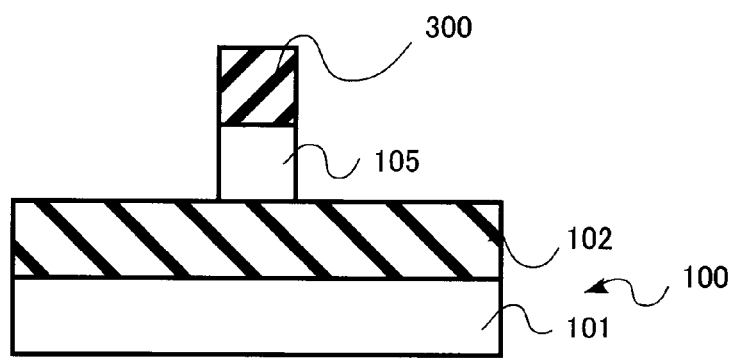

Next, as shown in a plan view of FIG. 13 along with FIGS. 14 and 15 depicting sectional views taken along lines E-E and F-F of FIG. 13 respectively, the upper silicon layer on the buried dielectric film 102 is etched by RIE with the dielectric film 300 being as a mask therefor. With this etching, a channel region 105 is formed, which is of the type having a fine-line 3D structure with its width and height being set to 10 nm or less, respectively. Optionally, p-type impurity for threshold adjustment may be doped by ion implantation techniques, when the need arises.

Figure 16:
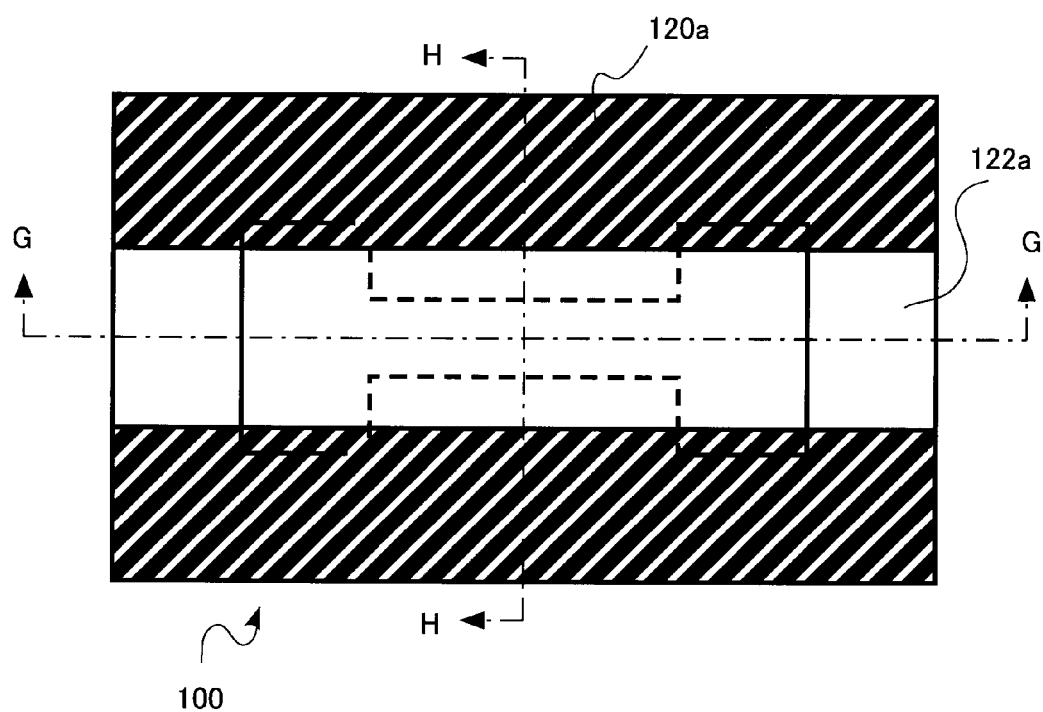
Figure 17:
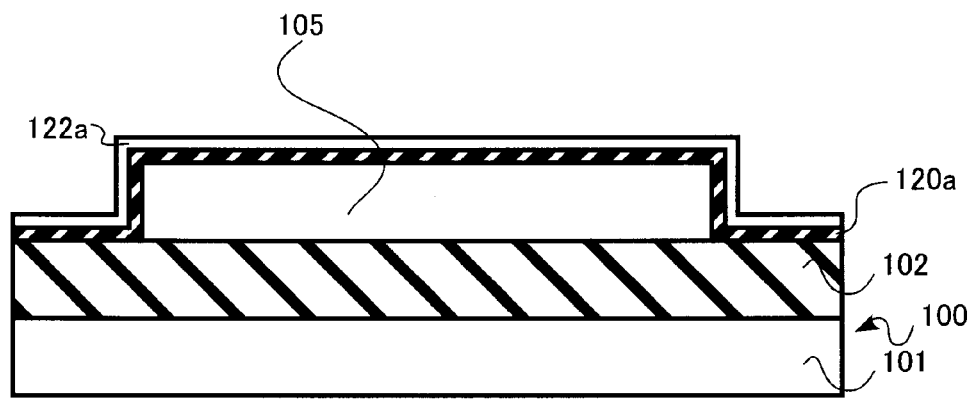
Figure 18:
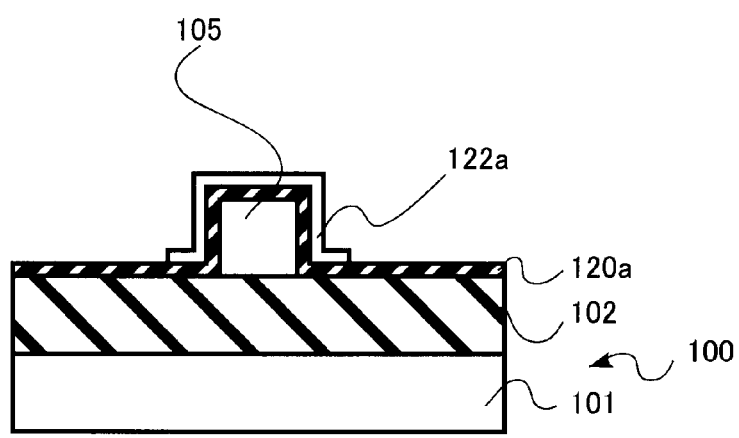

Next, as shown in a plan view of FIG. 16 along with FIGS. 17-18 depicting sectional views taken along lines G-G and H-H of FIG. 16, the dielectric film 300 is removed away by wet etching or else. Thereafter, a silicon oxide film 120a for later use as a tunnel insulator film is formed by thermal oxidation to a thickness of about 10 nm, for example. Subsequently, a silicon nitride film 122a for later use as a charge storage insulator film is formed by chemical vapor deposition (CVD) to a thickness of about 20 nm as an example. Then, the silicon nitride film 122a is patterned by lithography and RIE techniques.

Figure 19:
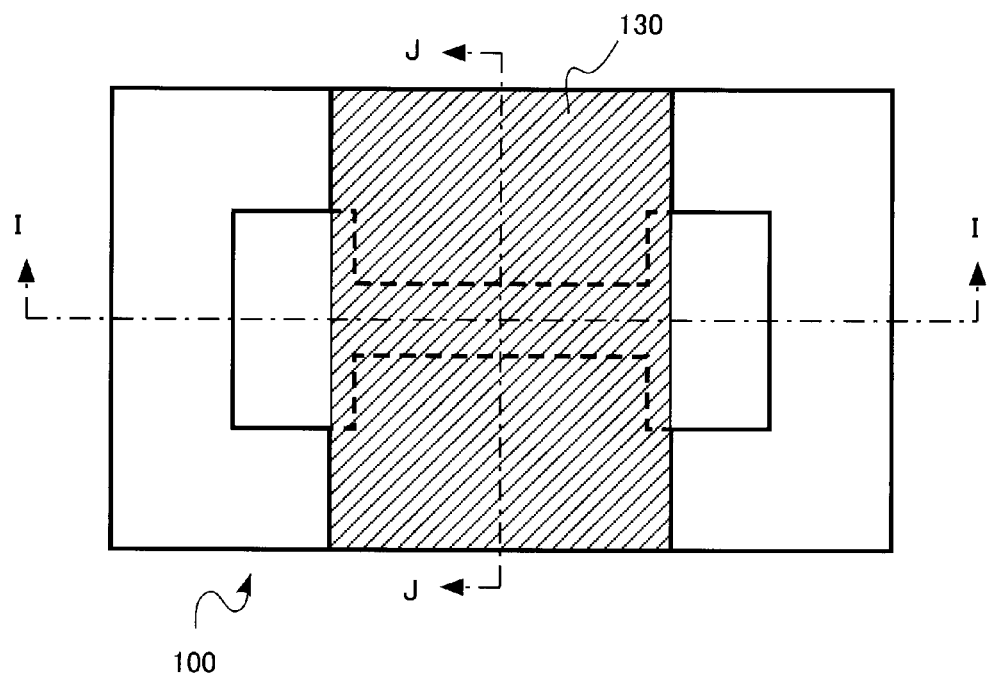
Figure 20:
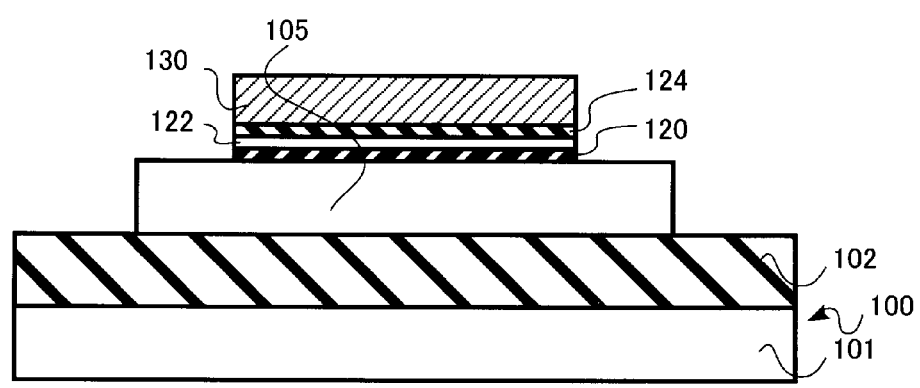
Figure 21:
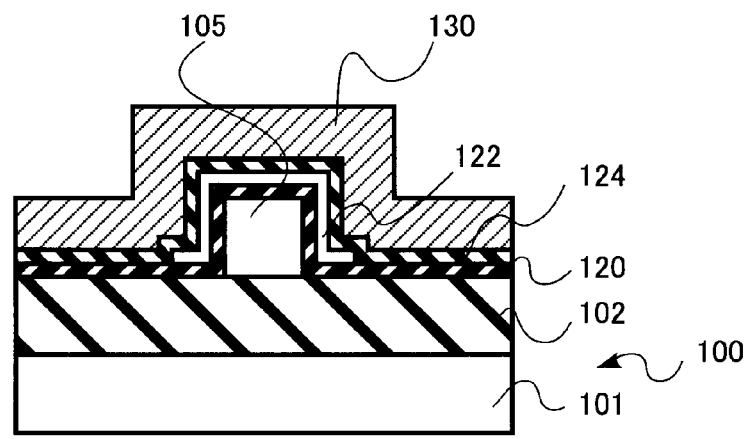

Next, as shown in a plan view of FIG. 19 along with FIGS. 20-21 depicting sectional views along lines I-I and J-J of FIG. 19, a silicon oxide film 124 of 10 nm thick, for example, is formed by CVD on top surfaces of the patterned silicon nitride film 122a and silicon nitride film 120a. This film 124 is for later use as a control dielectric film. Then, a polysilicon film 130 of, e.g., 50 nm thick for later use as a control electrode is deposited by CVD techniques. Thereafter, lithography and RIE techniques are used to pattern the silicon oxide film and polysilicon film to thereby form a control dielectric film 124 and control electrode 130. In this process, the silicon oxide film and silicon nitride film underlying the control dielectric film 124 are also subjected to patterning, thereby to form a charge storage insulator film 122 and tunnel dielectric film 120.

Next, with the control electrode 130 as a mask, a chosen impurity of n type is doped by ion implantation into source and drain regions 141 and 143. In the way stated above, the semiconductor device embodying the invention shown in FIGS. 1-3 is fabricated.

In this embodiment, the channel region is not necessarily different in conductivity type from the source/drain regions. In other words, in the case of the source/drain regions being made of n-type semiconductor, it is not always required to form the channel region by p-type semiconductor.

An example is that the channel region is arranged to be the same in conductivity type as the source/drain regions to thereby provide what is called the depletion-mode field effect transistor (DFET). With such an arrangement, it becomes possible to suppress short-channel effects. This is due to deletion of the channel region while electrons are accumulated at the charge storage insulator film in memory cell transistors of the depletion type as formed on or above silicon on insulator (SOI) structure. This contributes to further miniaturization of memory cells.

Second Embodiment

Figure 22:
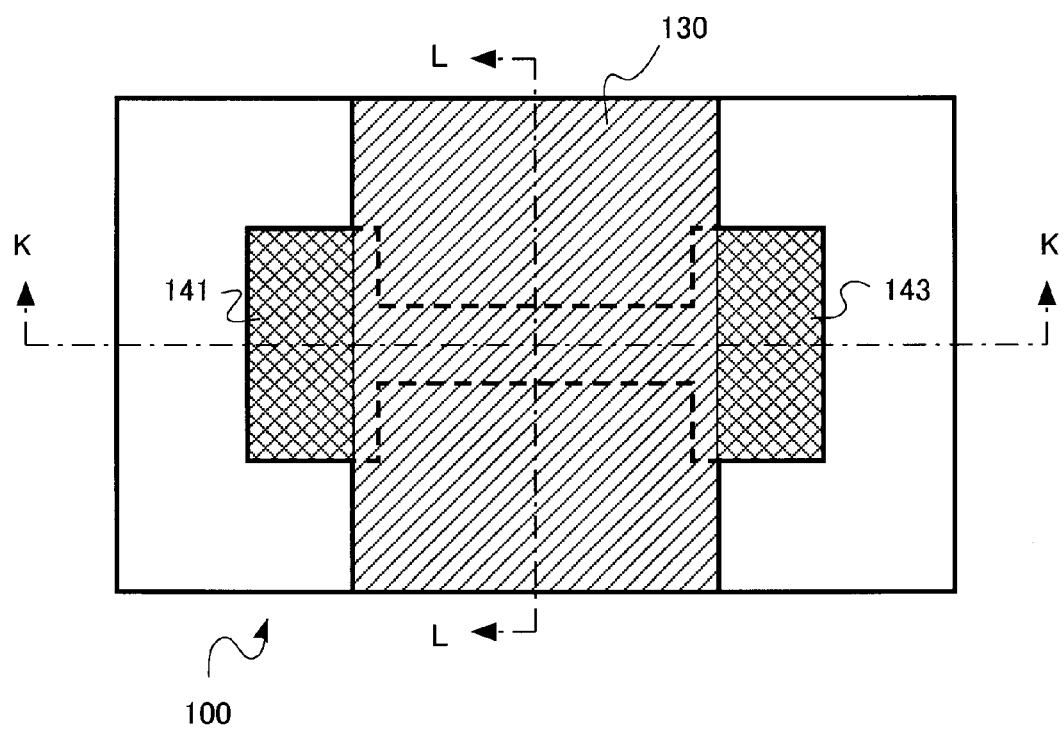
FIG. 22 is an upper plan view of a semiconductor device including a SONOS NVSM memory cell in accordance with another embodiment of this invention.
Figure 23:
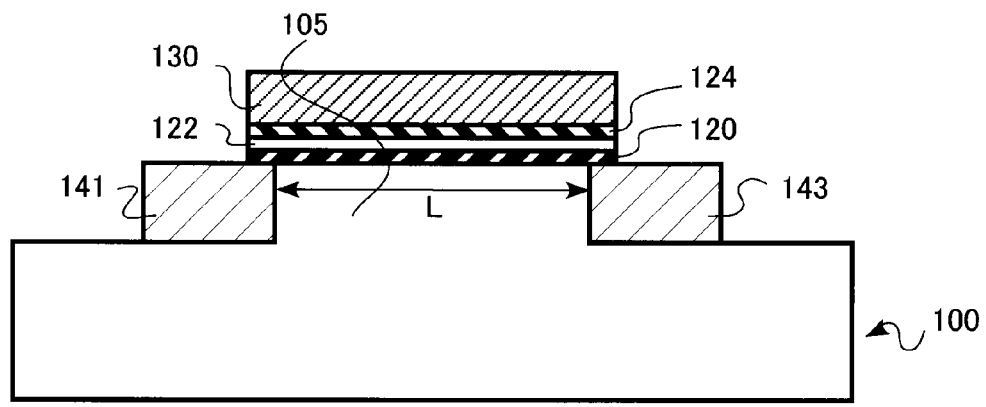
FIG. 23 shows a cross-sectional view of the device as taken along line K-K of FIG. 22.
Figure 24:
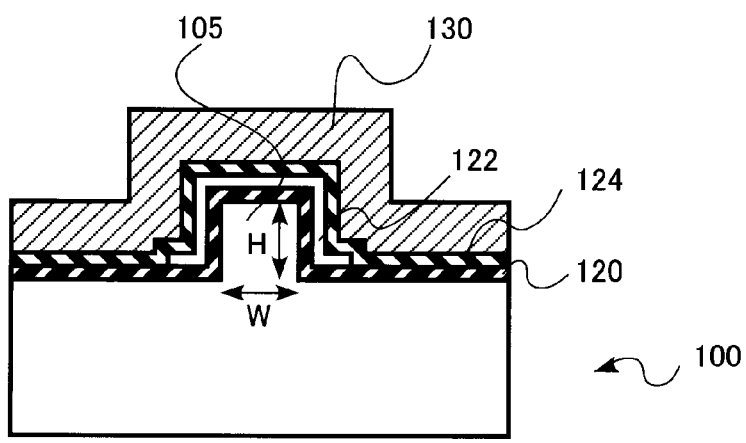
FIG. 24 is a sectional view of the device taken along line L-L in FIG. 22.

A semiconductor device including a SONOS NVSM cell structure in accordance with another embodiment of this invention is depicted in FIGS. 22 to 24, wherein FIG. 22 shows an upper plan view of the device, FIG. 23 shows a cross-sectional view as taken along line K-K of FIG. 22, and FIG. 24 is a sectional view along line L-L of FIG. 22. This embodiment device is similar to that shown in FIGS. 1-3 with the semiconductor substrate 100 being modified to have no buried dielectric film therein.

With the NVSM cell-including semiconductor device also embodying the invention, it becomes possible to reduce manufacturing costs by use of such buried dielectric-less substrate—namely, bulk substrate.

Third Embodiment

A semiconductor device having a SONOS NVSM cell in accordance with still another embodiment of this invention is similar to that shown in FIGS. 1-3 with the electron energy level of a trap level in the charge storage insulator film 122 shown in FIG. 1 being arranged to be lower than the energy level at an end of conduction band silicon.

Arranging the electron energy level at trap level in the charge storage insulator film 122 to be less than or equal to the energy level of silicon's conduction band end is reworded in a way that Et is zero (0) or less with the energy level of silicon conduction band end being as a reference, where Et is the electron energy level of trap level in the charge storage insulator film.

One possible approach to letting Et be 0 or less is to use as the charge storage insulator film either a hafnium oxide ($HfO_2$) film or a silicon nitride film with enlarged silicon composition ($Si_xN_y$, where $x/y > 3/4$).

By setting Et to 0 or less as in this embodiment, it is possible to advantageously reduce the tunnel probability of electrons from the charge storage insulator film into channel region while attaining the advantages of the first embodiment stated supra.

An explanation will be given of the principle of reducing the tunnel probability of electrons from the charge storage insulator film into channel region to thereby increase the memory data retention time, along with calculation results, with reference to FIGS. 25 and 26 below.

Figure 25:
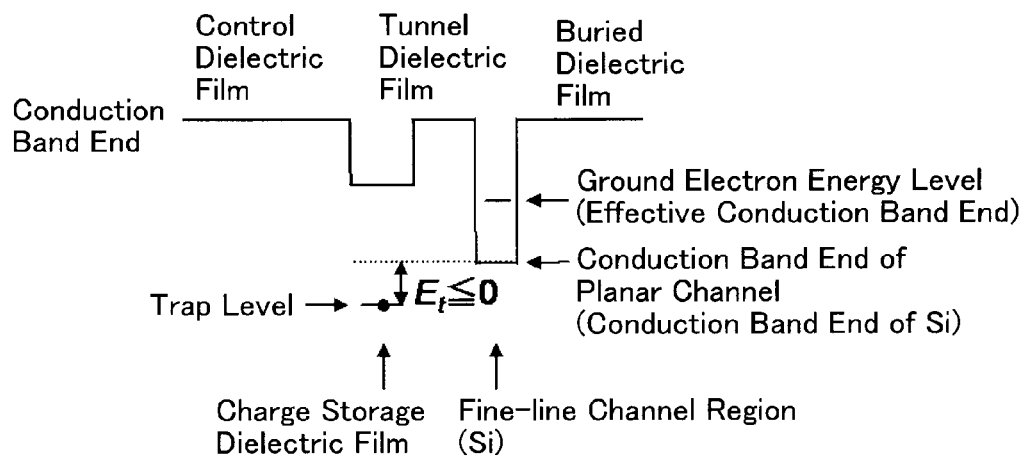
FIG. 25 is an energy diagram of a semiconductor device of a further embodiment in a direction at right angles to the surface of a silicon substrate.

FIG. 25 shows an energy diagram of this embodiment in a direction at right angles to the surface of silicon substrate. As shown herein, Et becomes less than or equal to 0, and the energy level of a trap level in the charge storage insulator film further drops down to be lower than the case of the first embodiment. This results in relative rise-up or elevation of the effective energy level at the end of conduction band of the fine-line 3D structured channel region. Accordingly, the tunnel probability of electrons from the charge storage insulator film into channel region is further reduced. Thus the advantage of increasing the length of data retention time of the memory is achievable.

Figure 26:
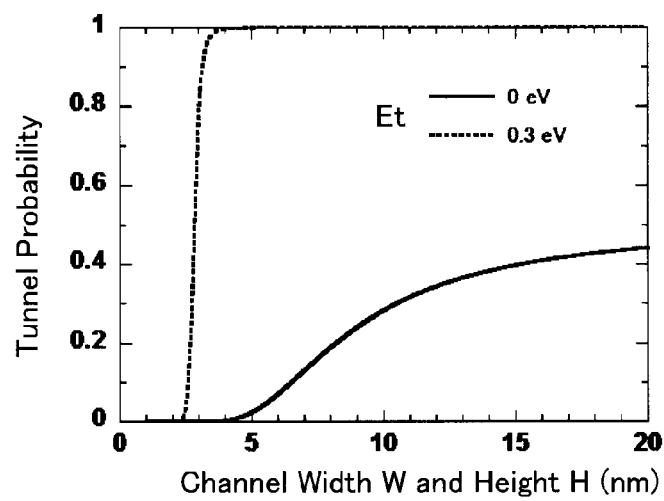
FIG. 26 is a graph showing calculation results of the dependency of electron tunneling probability from a charge storage insulator film to channel region of the further embodiment device versus channel region width W and height H.

Turning to FIG. 26, calculation results are shown of the channel width/height dependency of the tunnel probability of electrons from the charge storage insulator film into channel region in case the channel width W is equal to its height H. Here, the calculations are done under an assumption that the charge storage insulator film used is made of a chosen material with Et of 0 eV. For comparison, a curve of plots in the case of Et=0.3 eV is also shown in the graph of FIG. 26. Calculation conditions other than the condition of Et value setting are similar to those used for calculation of the data of FIG. 9.

As apparent from FIG. 26, in the case of Et=0 eV, the tunnel probability decreases drastically when compared to the case of Et=0.3 eV.

Fourth Embodiment

A semiconductor device having a SONOS NVSM cell in accordance with a further embodiment of this invention is similar to that shown in FIGS. 1-3 with the ground electron energy level of the channel region 105 shown in FIG. 1 being modified to be larger than that of silicon in the <110> direction on a (100) plane.

Note here that the arrangement for letting the ground electron energy level of channel region be larger than that of silicon in the <110> direction on (100) plane means more precisely that an inequality formula (1) of FIG. 27 is established.

Expressions on both sides of this equality (1) indicate ground electron energy levels of the channel region's with a vacuum level as a reference. More specifically, the right side term indicates the ground electron energy level of silicon in the <110> direction on the (100) plane whereas the left side term shows the ground electron energy level of a material of the channel region, which is an object to be compared.

An exemplary approach to letting the ground electron energy level of the channel region be larger than that of silicon in the <110> direction on (100) plane is to employ germanium as the material of the channel region and also to set the channel length direction to the <110> direction on a (100) plane of germanium. Note that the channel length direction as used herein refers to the direction of a flow of charge carriers, e.g., electrons, in the channel region.

With the electron energy-level setup feature unique to this embodiment for causing the ground electron energy level of the channel region to become greater than that of silicon in the <110> direction on the (100) plane, the device offers further enhanced quantum confinement effects of electrons in addition to attaining the advantages of the first embodiment. The electron quantum confinement enhancement permits the electron tunnel probability to decrease, thereby to further increase the data retention time of the memory.

The principle of reduction of the tunnel probability of electrons from the charge storage insulator film into channel region to thereby lengthen the memory data retention time in this embodiment will be described while referring to FIG. 28 below. An explanation will also be given of calculation results of the electron tunnel probability with reference to FIG. 29.

Figure 28:
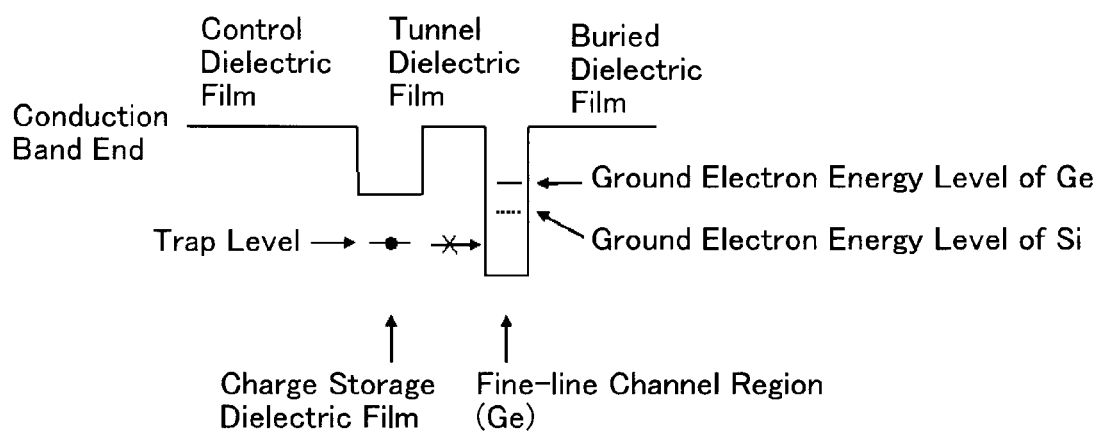
FIG. 28 is an energy diagram of the embodiment device in a direction perpendicular to the substrate surface.

FIG. 28 shows an energy diagram of this embodiment in a direction perpendicular to the substrate surface in an exemplary case where the channel region is made of germanium in the <110> direction on a (100) plane. In this embodiment, the ground electron energy level of the channel region is larger than that of silicon in the <110> direction on the (100) plane to thereby enhance the quantum confinement effect. In other words, changing silicon to germanium results riseup or elevation of the ground electron energy level of the fine-line type channel region—i.e., the effective conduction band end energy level. With this feature, it is expectable to advantageously further lower the electron tunnel probability when compared to the case of silicon used for the channel region, thereby increasing the data retention time of the memory.

Figure 29:
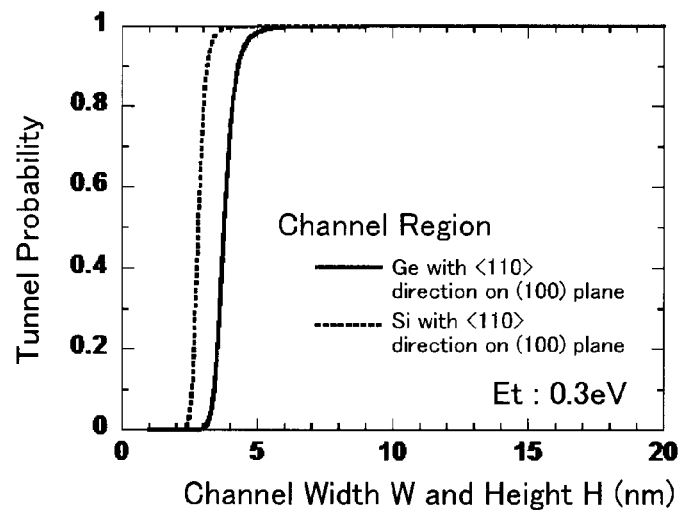
FIG. 29 is a graph showing calculation results of the dependency of tunnel probability of electrons from a charge storage insulator film to channel region of the embodiment device upon channel region width W and height H.

FIG. 29 graphically shows calculation results of the channel width/height dependency of the tunnel probability of electrons from the charge storage insulator film into channel region in case the channel width W is the same as the height H thereof. Here, the calculation was done under the conditions which follow: the channel region is made of germanium, and the channel length direction is identical to the <110> direction on the (100) plane of the germanium. For comparison purposes, calculation results in case the channel length direction is set to the <110> direction on a (100) plane of silicon are also shown in FIG. 29. The remaining conditions other than the channel region are similar to those used in calculation of the data of FIG. 9.

As apparent from viewing FIG. 29, in the case of the channel length direction being set to the <110> direction on the (100) plane of germanium, the electron tunnel probability begins to decrease from an area with relatively large width W and height H of the channel region when compared to the case of the <110> direction on (100) plane of silicon. Thus it can be said that it is possible to achieve the electron tunnel probability which is lower than that in the case of silicon.

Fifth Embodiment

Figure 30:
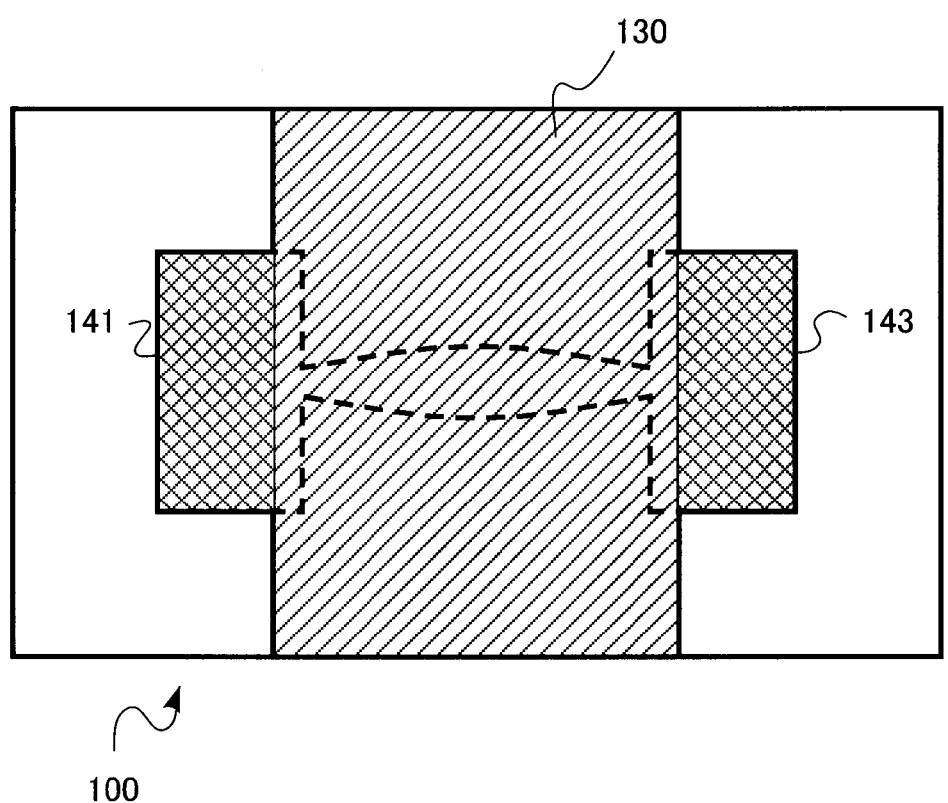
FIG. 30 is a plan view of a semiconductor device having a SONOS NVSM memory cell in accordance with still another further embodiment of the invention.

A semiconductor device having a SONOS NVSM cell in accordance with another further embodiment of this invention is shown in FIG. 30. This device is similar to that shown in FIGS. 1-3 with the channel region of the former being variable in width in a direction along the length thereof in a way such that its vertical cross-sectional areas at portions adjacent to the boundary with the source/drain regions are less than that at a middle part, thereby having outwardly curved sidewalls as shown in FIG. 30.

FIG. 30 shows an upper plan view of the SONOS NVSM cell structure also embodying the invention. As shown herein, its channel region is structured so that the width or height at the opposite ends is narrowed whereby the sectional area at such ends is less than that at its mid part. This both end-narrowed channel structure is readily manufacturable by, for example, designing a mask pattern for use in patterning of the channel region to have a pattern with its shape corresponding to the narrow end form.

With the channel region structure of this embodiment with its both ends being narrowed in width or in height, the sectional area at each channel end becomes smaller than that at its mid part. Thus it is possible to lower the write voltage of the memory.

By letting the both ends of channel region be less in sectional area than the mid part thereof, it is possible to induce stronger electron quantum confinement effects at the both ends of the channel region when compared to that at its mid part. This permits the channel region's both ends to rise up in energy level of conduction band in comparison with the mid part thereof, resulting in an increase in electrical resistivity at such end portions. As has been proposed, for example, in P. K. Ko et al., "Enhancement of hot-electron currents in graded-gate-oxide (GGO) MOSFETs," IEDM, pp. 88-91, 1984, in the case of flash memories, the presence of high resistive regions at the both ends of a channel region makes it possible to increase the carrier injection efficiency when "hot" electrons are injected by thermal injection techniques from the channel region into its associated charge storage insulator film. Consequently, using this feature, it becomes possible to lower the write voltage of the memory.

Sixth Embodiment

A semiconductor device in accordance with a further embodiment of this invention is arranged to have a serial combination of SONOS NVSM cells on a semiconductor substrate having a buried dielectric layer. Each memory circuit element—i.e., NVSM cell transistor—is generally made up of a channel region of the first type conductivity, which is 10 nm or less in width and height of cross-sectional area perpendicular to the channel length direction, a tunnel insulator film that is formed on a surface of the channel region, a charge storage insulator film formed on a surface of the tunnel insulator film, a control dielectric film formed on a surface of the charge storage insulator film, a control electrode on a surface of the control dielectric film, and a pair of spaced-apart source and drain regions of the first type conductivity as formed on the opposite sides of the channel region. The series array of NVSM cells includes at its one terminate end a select gate transistor having a channel region of the second type conductivity and a pair of source/drain regions. The NVSM cell array also includes a source-line contact area of the second type conductivity, which is formed to underlie the first conductivity type source region of the select gate transistor and which is electrically connected to the second conductivity type channel region of the select gate transistor. The cell array further includes a source-line contact plug for electrical connection to the first conductivity type source region of the select gate transistor and also for connection with the source-line contact area.

Figure 31:
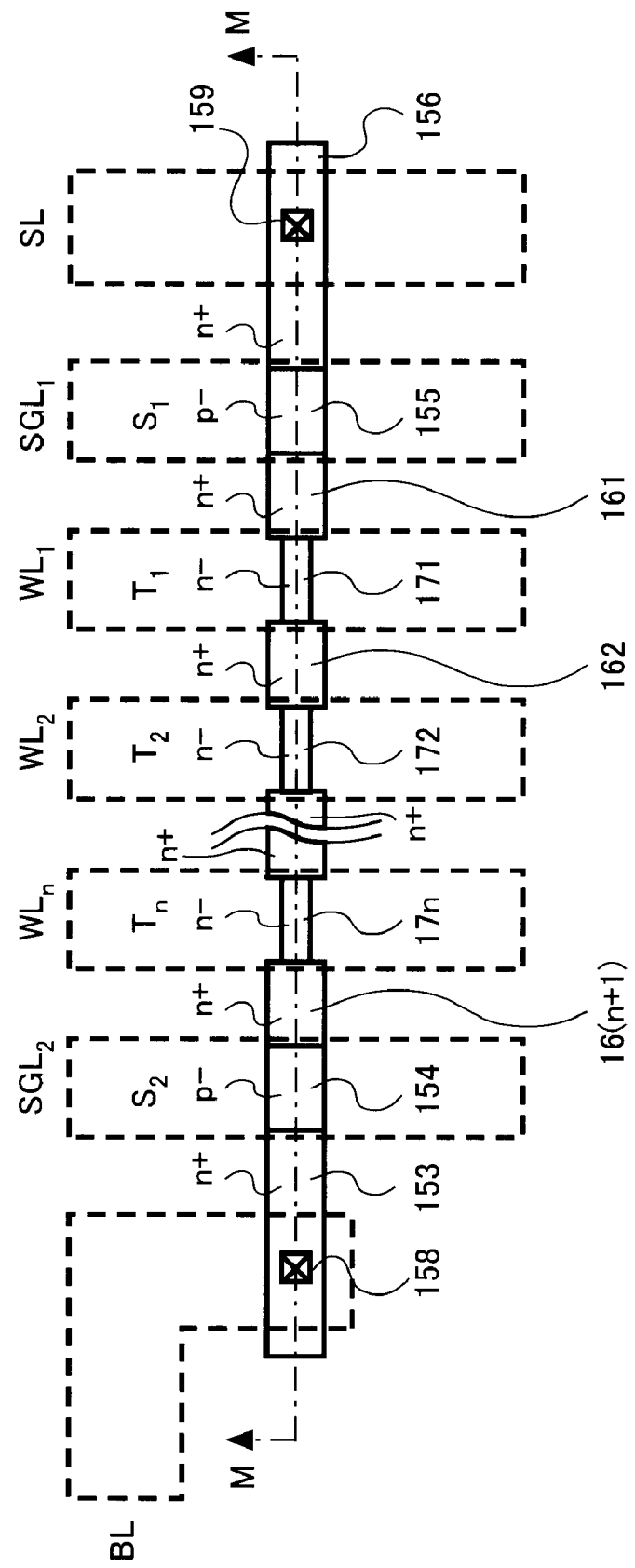
FIG. 31 is a plan view of a semiconductor device having a series array of SONOS NVSM cells in accordance with yet another further embodiment of the invention.
Figure 32:
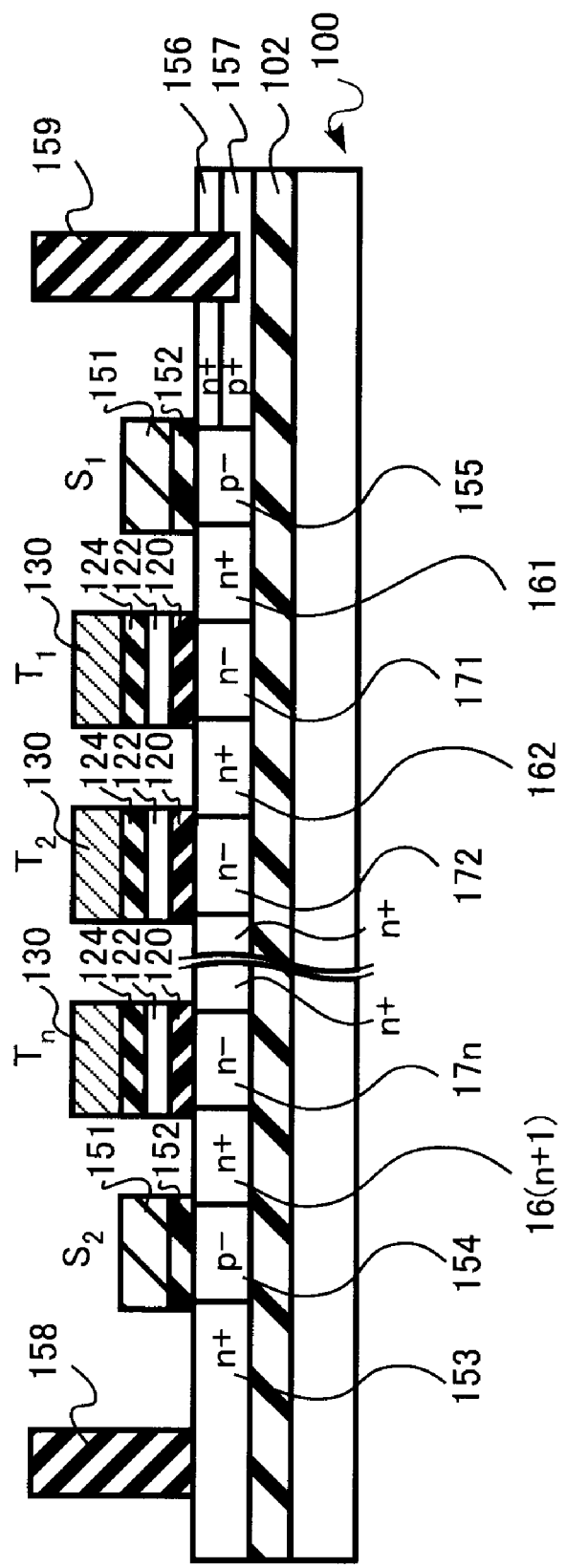
FIG. 32 is a sectional view of the device along line A-A of FIG. 31.
Figure 33:
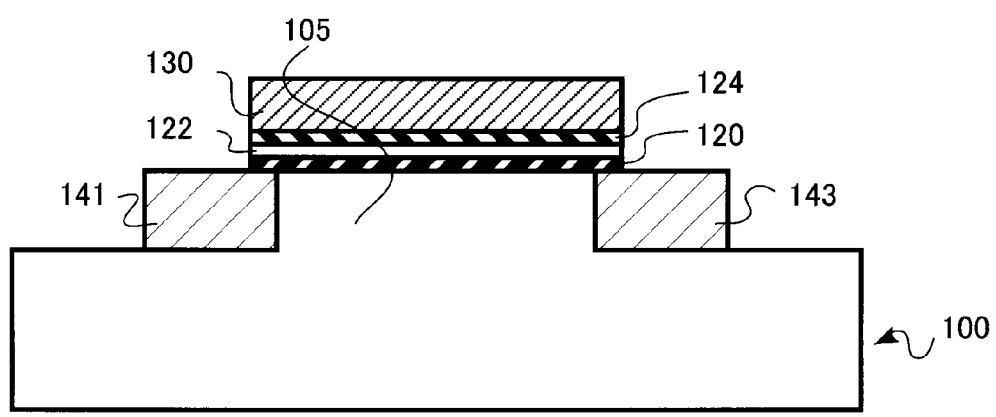
FIG. 33 is a sectional view of one prior known SONOS memory cell.
Figure 34:
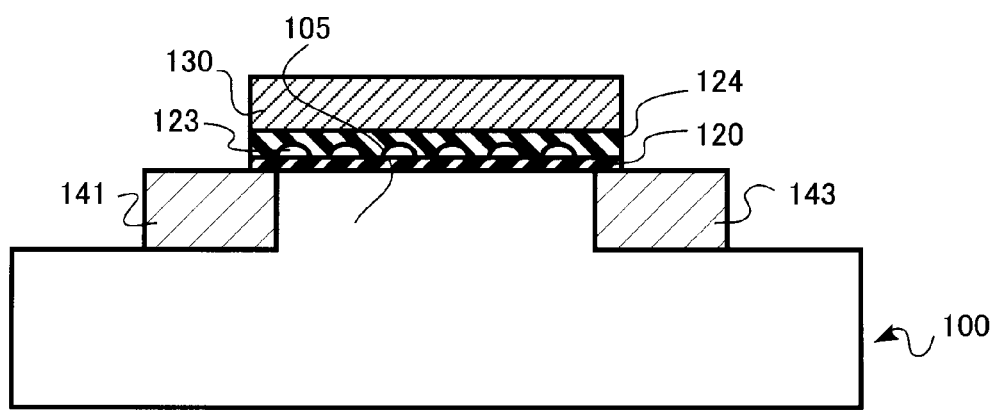
FIG. 34 is a sectional view of a prior art silicon microcrystal memory cell.
Figure 35:
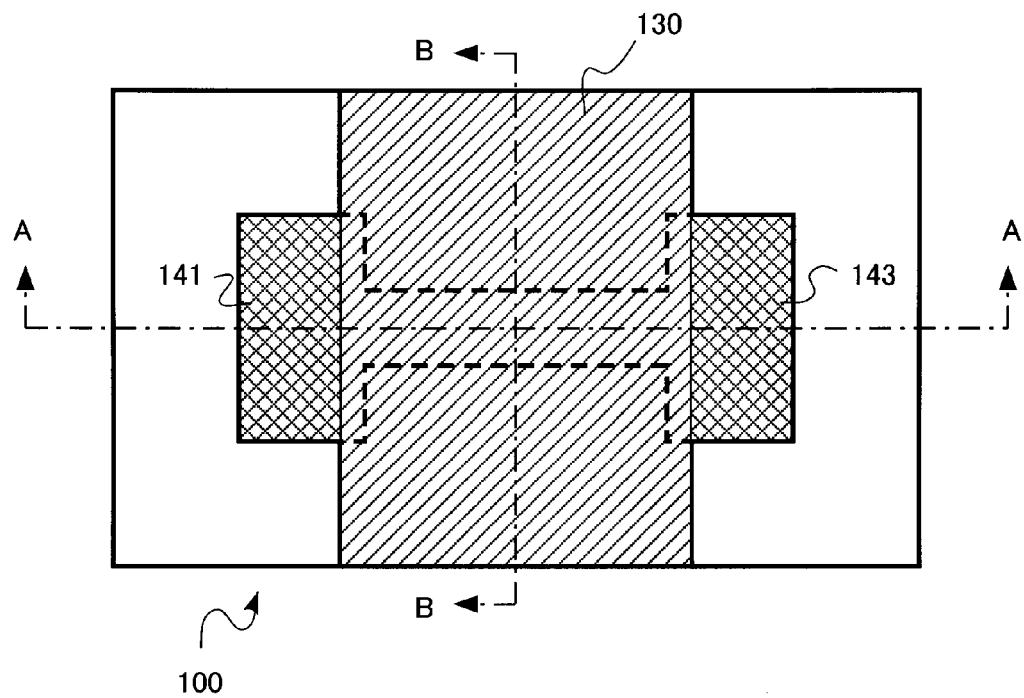
FIG. 35 is a plan view of a prior art fine-line type silicon microcrystal memory cell.
Figure 36:
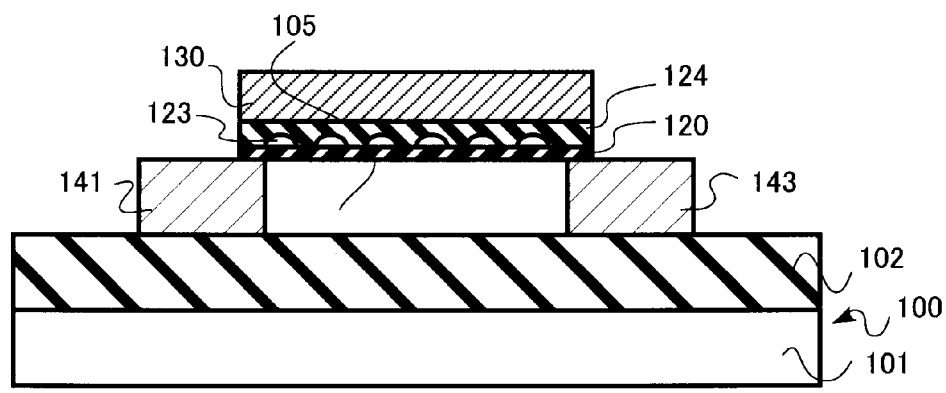
FIG. 36 is a sectional view of the memory cell as taken along line A-A of FIG. 35; and, FIG. 37 is a sectional view of the cell along line B-B of FIG. 35.
Figure 37:
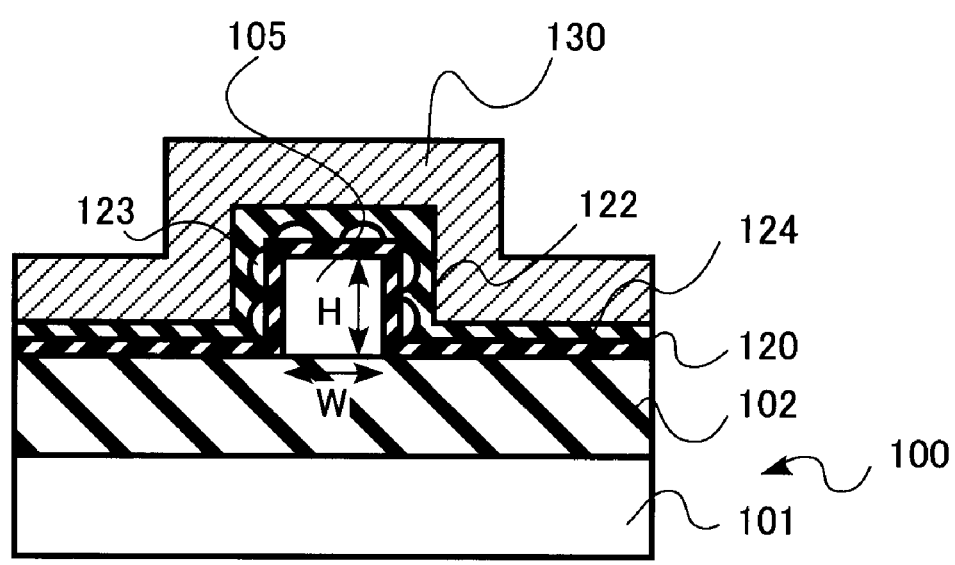

An upper plan view of major part of this embodiment semiconductor device is depicted in FIG. 31. Its sectional structure taken along line M-M is shown in FIG. 32. This device will be described in detail below with reference to these figures of the drawing.

A semiconductor substrate 100 has a buried dielectric film 102. On this substrate, a series array of one-transistor memory cells, i.e., memory cell transistors $T_1$-$T_n$, is formed. These memory cell transistors are each arranged to have a fine-line type 3D channel structure. This cell structure is similar to that shown in FIGS. 1-3.

As better shown in FIG. 31, these memory cell transistors $T_1$-$T_n$ are linearly laid out and serially connected together. This series cell array is associated with a couple of select gate transistors $S_1$ and $S_2$, which are formed adjacent to the opposite ends of the array.

Each memory cell transistor $T_1, T_2, \ldots, T_n$ has a gate which is connected to a corresponding one of word lines $WL_1$ to $WL_n$. The select gate transistors $S_1$-$S_2$ have gates connected to select gate lines $SGL_1$ and $SGL_2$, respectively. Select gate transistor $S_2$ has its drain region 153, which is connected via a bit-line contact plug 158 to a bit line BL associated therewith. Select gate transistor $S_1$ has a source region 156 connected via a source-line contact plug 159 to a source line SL.

With such an arrangement, this embodiment device has a circuit configuration of the so-called "NAND Flash" memory.

Note here that the memory cell transistors $T_1$-$T_n$ have channel regions 171 to 17n and source/drain regions 161 to 16(n+1), all of which are of the n conductivity type. With this conductivity type setting, the memory cell transistors operate as the so-called depletion-type FETs (DFETs). Using the DFETs for the memory cell transistors makes it possible to suppress short-channel effects of the memory cell transistors $T_1$-$T_n$ as discussed previously in conjunction with the first embodiment memory device.

Regarding the select gate transistors $S_1$-$S_2$, their channel regions 155 and 154 are arranged to have p type conductivity whereas source regions 156 and 16(n+1) and drain regions 161 and 153 are of the n type conductivity. With this setting, these transistors operate as the so-called enhancement-type FETs (EFETs).

A p-type source-line contact area 157 is provided beneath the source region 156 of the source-line side select gate transistor $S_1$. The source region 156 and source-line contact area 157 are electrically connected together to the source-line contact plug 159.

As generally known among skilled persons in the semiconductor device art, NAND flash memories using SOI substrate similar to the embodiment device are faced with a problem as to difficulties in all-at-a-time data erase operations because of the fact that the capacitive coupling between the channel region and substrate is relatively weak. More specifically, upon execution of all-at-once erasure of data of more than two serial connected memory cells, the channel region of each memory cell does not increase in potential even upon application of a positive voltage to the substrate due to its failure to sufficiently keep track with a potential riseup of the positive voltage.

To avoid this problem, the embodiment semiconductor device is arranged so that the p-type source-line contact area 157 is provided beneath the n-type source region 156 of the source-line side select gate transistor $S_1$. Additionally the source region and the source-line contact area are electrically connected together to the source-line contact plug 159.

A prior known SOI substrate-used NAND flash memory, which is similar to the embodiment except that this does not use the fine-line 3D channel structure in memory cell transistors, is disclosed in JP-A 2006-294940 (KOKAI).

In the absence of the p-type source-line contact area, the positive voltage application to the source line merely results in the p-n junction being reverse biased between the p-type channel region of source-line side select gate transistor and the n-type source region. This is a bar to sufficient potential riseup of the channel region of such select gate transistor. Obviously, any sufficient potential riseup is hardly expectable for the channel region of a memory cell transistor being connected in series thereto.

On the contrary, in the presence of the p-type source-line contact area as in this embodiment, when applying a positive voltage to the source line, the potential is smoothly transferred from the p-type source-line contact to the p-type channel region. Accordingly, the channel region of every series-connected memory cell transistor also rises up in potential while keeping pace with the potential transfer. This permits electrons to be released from its floating gate to channel in a way pursuant to an increase in potential of the memory cell transistor's channel region. This makes it possible to achieve the successful all-at-once erase of memory cell data without having to relying upon the voltage being applied to the substrate.

An exemplary fabrication method of the semiconductor device of the embodiment stated above is as follows. A series array of NVSM cells each being similar in structure to that shown in FIGS. 1-3 is formed on an SOI substrate. Then, use standard transistor fabrication techniques to form a couple of select gate transistors at the opposite ends of the cell array.

Then, form a source-line contact area beneath one of the select gate transistors at a terminate end of the memory cell array—i.e., the source-line side select gate transistor. In this process, a chosen ion species of the opposite conductivity type to that of the source region is doped or injected under the application of an acceleration voltage with its potential being higher than that used for fabrication of the source region. In the case of the example stated above, the source region is of the n-type, so a p-type impurity is doped to form the source-line contact area.

Next, after having deposited an interlayer dielectric (ILD) film, form in the source region of source-line-side select gate transistor a through-going hole extending to reach the source-line contact area by using known lithography and RIE techniques. Thereafter, fill the through-hole with a metallic film or else by known CVD methods, thereby to form a source-line contact plug.

It should be noted that the present invention should not be construed to be limited only to the illustrative embodiments. Although in the embodiments the semiconductor devices are arranged to employ as the data storage cells n-channel MOSFETs (NMOSFETs) with electrons serving as current-carrying charge thereof, the principles of this invention is also applicable to semiconductor devices having memory cells formed of p-channel MOSFETs (PMOSFETs) with holes serving as the current carrier. Additionally, in cases where the invention is applied to PMOSFET memory cells, it is necessary to replace the term "conduction band" with "valence band" in the description of the embodiments.

Also note that while in the illustrative embodiments the semiconductor substrate is made mainly of silicon (Si), this may be replaceable by other similar suitable semiconductive materials, examples of which include, but not limited to, silicon germanium (SiGe), germanium (Ge), silicon carbide (SiC), gallium arsenide (GaAs), aluminum nitride (AlN), gallium nitride (GaN) and indium antimonide (InSb). Alternatively a substrate made of such material with distortion applied thereto is employable.

Additionally, the lattice plane of substrate material should not exclusively be limited to the (100) plane and may alternatively be a (110) plane or a (111) plane through appropriate selection on a case-by-case basis. The principal concepts of the invention as disclosed herein are applicable to any types of semiconductor devices with one or more data storage circuit elements formed of metal insulator semiconductor field effect transistors (MISFETs) and may be reduced to practice while accompanying various modifications and alterations without departing from the true spirit of the invention.

Although the invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

What is claimed is:

1. A semiconductor device comprising:
   a semiconductor substrate;
   a channel region formed in the semiconductor substrate;
   a tunnel dielectric film formed on said channel region;
   a charge storage dielectric film formed on said tunnel dielectric film;

a control dielectric film formed on said charge storage dielectric film;

a control electrode formed on said control dielectric film; and a pair of source and drain regions formed on both sides of said channel region, wherein said channel region has a cross-section perpendicular to a channel length direction with its width and height being each set to 10 nanometers (nm) or less, and a boundary between said channel region and any one of said source and drain regions has a smaller cross-sectional area of said channel region perpendicular to the channel length direction than a central part of said channel region has.

2. The device according to claim 1, wherein said semiconductor substrate has a buried dielectric film.

3. The device according to claim 1, wherein said charge storage dielectric film has therein a trap level with its area density being greater than or equal to $5E12$ cm$^{-2}$ and yet less than or equal to $1E14$ cm$^{-2}$.

4. The device according to claim 1, wherein said charge storage dielectric film has a trap level with its electron energy level being less than or equal to an electron energy level at an end of conduction band of silicon.

5. The device according to claim 1, wherein said charge storage dielectric film has a trap level with its hole energy level being less than or equal to a hole energy level at an end of valence band of silicon.

6. The device according to claim 1, wherein said charge storage dielectric film is made of silicon nitride as expressed by $Si_xN_y$, where suffixes x and y are such that x/y is larger than 3/4 (x/y>3/4).

7. The device according to claim 1, wherein said charge storage dielectric film is made of hafnium oxide.

8. The device according to claim 1, wherein said channel region is made of silicon.

9. The device according to claim 1, wherein said tunnel dielectric film is a silicon oxide film.

10. The device according to claim 1, wherein said control dielectric film is a silicon oxide film.

11. The device according to claim 1, wherein said channel region has a ground electron energy level being greater than an ground electron energy level of silicon in a <110> direction on a (100) plane.

12. The device according to claim 1, wherein said channel region is made of germanium and wherein the channel length direction is a <110> direction on a (100) plane.

13. The device according to claim 1, wherein said channel region has its width and height of a cross-section perpendicular to the channel length direction, each of said width and height being less than or equal to 4 nm.

14. The device according to claim 2, wherein said channel region is the same as said source and drain regions in conductivity type of semiconductor used thereof.

15. A semiconductor device comprising:

a semiconductor substrate having a buried dielectric layer;

an array of memory cells formed on the semiconductor substrate;

each said memory cell including, a channel region of a first conductivity type having a cross-section perpendicular to a channel length direction with its width and height being each set to less than or equal to 10 nm, a tunnel dielectric film formed on said channel region, a charge storage dielectric film formed on said tunnel dielectric film, a control dielectric film formed on said charge storage dielectric film, a control electrode formed on said control dielectric film, and a pair of source and drain regions of the first conductivity type as formed on both sides of said channel region, wherein a boundary between said channel region and any one of said source and drain regions has a smaller cross-sectional area of said channel region perpendicular to the channel length direction than a central part of said channel region has;

a select gate transistor being placed adjacent to a one end of the array of memory cells and having a channel region of a second conductivity type and a pair of source and drain regions of the first conductivity type;

a source line contact region of the second conductivity type being formed to underlie the source region of said select gate transistor and being electrically connected to the channel region of said select gate transistor; and a source line contact plug being electrically connected to the source region of said select gate transistor and being electrically connected to said source line contact region.

16. The device according to claim 15, wherein said charge storage dielectric film has a trap level with its area density being greater than or equal to $5E12$ cm$^{-2}$ and yet less than or equal to $1E14$ cm$^{-2}$.

17. The device according to claim 15, wherein said charge storage dielectric film has an electron energy level being less than or equal to an electron energy level at an end of conduction band of silicon.

18. The device according to claim 15, wherein said charge storage dielectric film is made of $Si_xN_y$, where x/y is larger than 3/4.

19. The device according to claim 15, wherein said channel region is made of silicon.

20. A semiconductor device comprising:

a channel region formed of a semiconductor;

a tunnel dielectric film formed on said channel region;

a charge storage dielectric film formed on said tunnel dielectric film;

a control dielectric film formed on said charge storage dielectric film;

a control electrode formed on said control dielectric film; and a pair of source and drain regions formed on both sides of said channel region, wherein said channel region has a cross-section perpendicular to a channel length direction with its width and height being each set to 10 nanometers (nm) or less, and a boundary between said channel region and any one of said source and drain regions has a smaller cross-sectional area of said channel region perpendicular to the channel length direction than a central part of said channel region has.

* * * * *